United States Patent
Park et al.

(10) Patent No.: US 10,636,962 B2
(45) Date of Patent: Apr. 28, 2020

(54) SPIN-ORBIT TORQUE (SOT) MAGNETIC TUNNEL JUNCTION (MTJ) (SOT-MTJ) DEVICES EMPLOYING PERPENDICULAR AND IN-PLANE FREE LAYER MAGNETIC ANISOTROPY TO FACILITATE PERPENDICULAR MAGNETIC ORIENTATION SWITCHING, SUITABLE FOR USE IN MEMORY SYSTEMS FOR STORING DATA

(71) Applicant: QUALCOMM Incorporated, San Diego, CA (US)

(72) Inventors: Chando Park, Palo Alto, CA (US); Sungryul Kim, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/107,484

(22) Filed: Aug. 21, 2018

(65) Prior Publication Data
US 2020/0066968 A1    Feb. 27, 2020

(51) Int. Cl.
H01L 43/02  (2006.01)
H01L 43/10  (2006.01)
(Continued)

(52) U.S. Cl.
CPC ............ *H01L 43/02* (2013.01); *G11C 11/161* (2013.01); *H01F 10/3254* (2013.01);
(Continued)

(58) Field of Classification Search
None
See application file for complete search history.

(56) References Cited

U.S. PATENT DOCUMENTS 9,343,658 B2    5/2016   Wang et al.
9,620,562 B2    4/2017   Katine
(Continued)

OTHER PUBLICATIONS

Cubukcu, Murat et al., "Ultra-fast magnetization reversal of a three-terminal perpendicular magnetic tunnel junction by spin-orbit torque," ARXIV, arXiv:1509.02375, Sep. 2015, 23 pages.
(Continued)

*Primary Examiner* — Michelle Mandala
(74) *Attorney, Agent, or Firm* — W&T/Qualcomm

(57) ABSTRACT

Aspects disclosed include spin-orbit torque (SOT) magnetic tunnel junction (MTJ) (SOT-MTJ) devices employing perpendicular and in-plane free layer magnetic anisotropy to facilitate perpendicular magnetic orientation switching. A free layer in a MTJ in the SOT-MTJ device includes both a perpendicular magnetic anisotropy (PMA) region(s) and an in-plane magnetic anisotropy (IMA) region(s). A spin torque is generated in the free layer when a SOT switching current flows through an electrode adjacent to the free layer sufficient to switch the magnetic moment of the free layer to an in-plane magnetic orientation. To prevent a non-deterministic perpendicular magnetic orientation after the SOT switching current is removed, the free layer also includes the IMA region(s) to provide an in-plane magnetization to generate an effective magnetic field in the free layer to assist in switching the magnetic moment of the free layer past an in-plane magnetic orientation to a perpendicular magnetic orientation.

29 Claims, 19 Drawing Sheets

(51) Int. Cl.
  *H01L 43/12* (2006.01)
  *H01F 10/32* (2006.01)
  *G11C 11/16* (2006.01)
  *H01L 27/22* (2006.01)

(52) U.S. Cl.
  CPC ....... *H01F 10/3286* (2013.01); *H01L 27/228* (2013.01); *H01L 43/10* (2013.01); *H01L 43/12* (2013.01); *G11C 11/1657* (2013.01); *G11C 11/1673* (2013.01); *G11C 11/1675* (2013.01)

(56) References Cited

U.S. PATENT DOCUMENTS

| | | |
|---|---|---|
| 9,666,256 B1 | 5/2017 | Lai et al. |
| 9,824,735 B1 | 11/2017 | Kan et al. |
| 9,830,966 B2 | 11/2017 | Mihajlovic et al. |
| 10,056,430 B1* | 8/2018 | Mihajlovic ......... G11C 11/1675 |
| 10,347,310 B2* | 7/2019 | Choi ....................... H01L 43/08 |
| 2012/0299134 A1* | 11/2012 | Jan ......................... H01L 43/08 257/421 |
| 2017/0170388 A1* | 6/2017 | Whig ..................... H01L 43/02 |

OTHER PUBLICATIONS

Fukami, Shunsuke et al., "Magnetization switching by spin-orbit torque in an antiferromagnet-ferromagnet bilayer system," Nature Materials, vol. 15, May 2016, pp. 535-542.

Miron, Ioan Mihai et al, "Perpendicular switching of a single ferromagnetic layer induced by in-plane current Injection," Nature, vol. 476, Aug. 11, 2011, pp. 189-194.

Van Den Brink, A. et al., "Spin-Hall-assisted magnetic random access memory," Applied Physics Letters, vol. 104, 2014, 3 pages.

\* cited by examiner

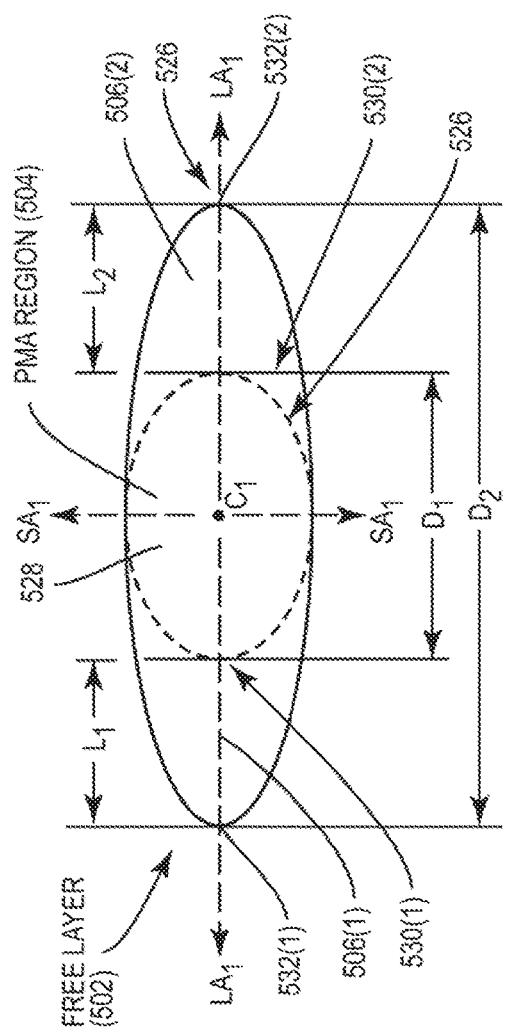
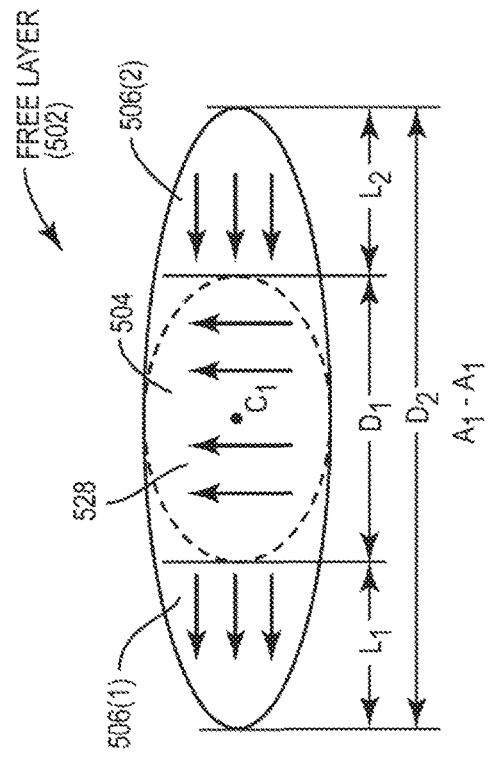
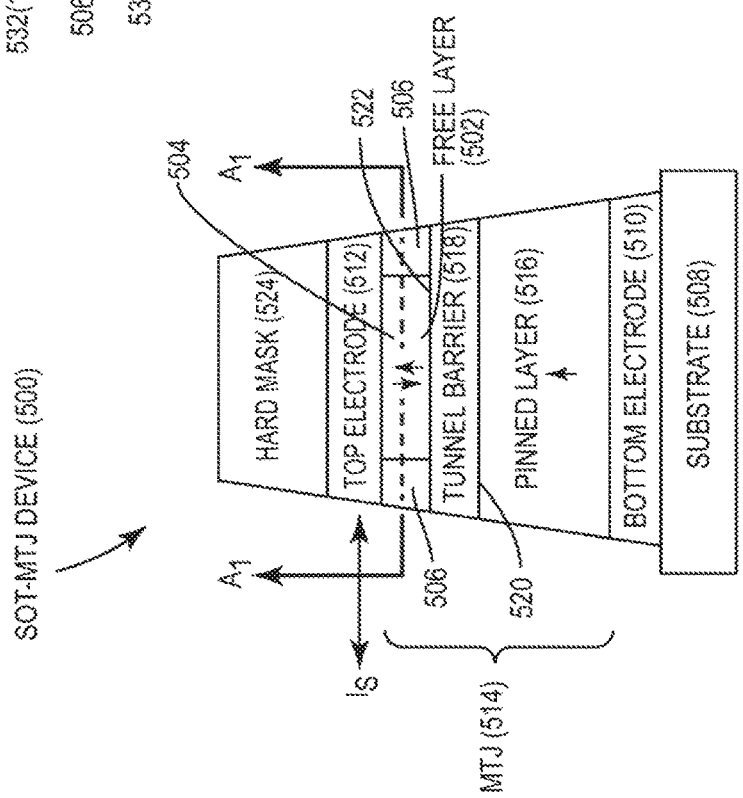
FIG. 5B
FIG. 5C
FIG. 5A

SPIN-ORBIT TORQUE (SOT) MAGNETIC TUNNEL JUNCTION (MTJ) (SOT-MTJ) DEVICES EMPLOYING PERPENDICULAR AND IN-PLANE FREE LAYER MAGNETIC ANISOTROPY TO FACILITATE PERPENDICULAR MAGNETIC ORIENTATION SWITCHING, SUITABLE FOR USE IN MEMORY SYSTEMS FOR STORING DATA

BACKGROUND

I. Field of the Disclosure

The technology of the disclosure relates generally to switching of magnetic orientation in magnetic tunnel junctions (MTJs), wherein the MTJs can be employed in memory bit cells in a memory system to store a memory state as a function of the stored magnetic orientation.

II. Background

Semiconductor storage devices are used in integrated circuits (ICs) in electronic devices to provide data storage. One example of a semiconductor storage device is static random access memory (SRAM). Conventional SRAM-based cache is very fast, but it has low density and expensive costs. To resolve the disadvantage of SRAM cache, magneto-resistive random access memory (MRAM) can be employed in memory to provide data storage. MRAM is non-volatile memory in which data is stored by programming a magnetic tunnel junction (MTJ) as part of an MRAM bit cell. One advantage of MRAM is that MTJs in MRAM bit cells can retain stored information even when power is turned off. This is because data is stored in the MTJ as a small magnetic element rather than as an electric charge or current. MRAM has high-density characteristics and non-volatile features, which can be used in computer cache memory designs.

In this regard, an MTJ comprises a free ferromagnetic layer ("free layer") disposed above or below a fixed or pinned ferromagnetic layer ("pinned layer"). The free and pinned layers are separated by a tunnel junction or barrier formed by a thin non-magnetic dielectric layer. The magnetic orientation of the free layer can be changed, but the magnetic orientation of the pinned layer remains fixed or "pinned." Data can be stored in the MTJ according to the magnetic orientation between the free layer and the pinned layer. When the magnetic orientations of the free and pinned layers are anti-parallel (AP) to each other, a first memory state exists (e.g., a logical '1'). When the magnetic orientations of the free and pinned layers are parallel (P) to each other, a second memory state exists (e.g., a logical '0'). The magnetic orientations of the free and pinned layers can be sensed to read data stored in the MTJ by sensing a resistance when current flows through the MTJ. Data can also be written to and stored in the MTJ by applying a magnetic field to change the magnetic orientation of the free layer to either a P or AP magnetic orientation with respect to the pinned layer.

Recent developments in MTJ devices involve spin-transfer torque (STT)-MRAM devices. In STT-MRAM devices, the spin polarization of carrier electrons, rather than a pulse of a magnetic field, is used to program the state stored in the MTJ (i.e., a '0' or a '1'). In this regard, FIG. 1 illustrates an exemplary MRAM bit cell 100 that includes a metal-oxide semiconductor (MOS) (typically N-type MOS, i.e., NMOS) access transistor 102 integrated with a STT-MTJ device 104 for storing non-volatile data. The MRAM bit cell 100 may be provided in an MRAM memory used as memory storage for any type of system requiring electronic memory, such as a central processing unit (CPU) or processor-based system, as examples. The STT-MTJ device 104 includes a perpendicular MTJ (pMTJ) 105 that includes a pinned ferromagnetic layer ("pinned layer") 106 and a free ferromagnetic layer ("free layer") 108 disposed on either side of a tunnel barrier 110 formed by a thin non-magnetic dielectric layer. In a perpendicular MTJ, the free layer 108 and pinned layer 106 are made from perpendicular magnetic anisotropy (PMA) materials such that their magnetic moments are perpendicular to a substrate on which the pMTJ is disposed. PMA materials have more uniform magnetization and do not suffer from thermal instability as in-plane materials, thus making it easier to reverse the magnetization of the free layer.

With continuing reference to FIG. 1, when the magnetic orientations of the pinned and free layers 106, 108 in the pMTJ 105 are AP to each other, a first memory state exists (e.g., a logical '1'). When the magnetic orientations of the pinned and free layers 106, 108 are P to each other, a second memory state exists (e.g., a logical '0'). Further, the access transistor 102 controls reading and writing data to the STT-MTJ device 104. A drain D of the access transistor 102 is coupled to a bottom electrode 112 of the STT-MTJ device 104, which is coupled to the pinned layer 106. A word line 114 is coupled to a gate G of the access transistor 102. A source S of the access transistor 102 is coupled to a source line 116, which is coupled to a write driver circuit 118. A bit line 120 is coupled to the write driver circuit 118 and a top electrode 122 of the STT-MTJ device 104, which is coupled to the free layer 108.

With continuing reference to FIG. 1, to read data from the MRAM bit cell 100, a voltage differential is applied between the source line 116 and the bit line 120. The gate G of the access transistor 102 is activated by activating the word line 114 to create a circuit with a read driver circuit (not shown) to cause a read current $I_R$ to flow through the pMTJ 105. The voltage is applied between the source line 116 and the bit line 120 such that the direction of the read current $I_R$ flows from the free layer 108 to the pinned layer 106. The read current $I_R$ is sensed as an indication of the resistance of the pMTJ 105 indicating whether the free layer 108 is in a P or AP magnetic orientation with respect to the pinned layer 106, and hence whether the pMTJ 105 stores a logic '0' or '1' value. When writing data to the pMTJ 105, a larger voltage differential is applied between the source line 116 and the bit line 120 by the write driver circuit 118, and the gate G of the access transistor 102 is activated by activating the word line 114. This causes a write current $I_W$ larger than the read current $I_R$ to flow through the pMTJ 105. The write current $I_W$ must be strong enough to change the magnetic orientation of the free layer 108. If the magnetic orientation is to be changed from an AP to P magnetic orientation, the write current $I_W$ flowing from the top electrode 122 to the bottom electrode 112 induces STT at the free layer 108 that can change the magnetic orientation of the free layer 108 to P with respect to the pinned layer 106. If the magnetic orientation is to be changed from P to AP, a current flowing from the bottom electrode 112 to the top electrode 122 induces STT at the free layer 108 to change the magnetic orientation of the free layer 108 to AP with respect to the pinned layer 106.

FIG. 2 is a schematic diagram of exemplary material layers of the STT-MTJ device 104 in the MRAM bit cell 100 in FIG. 1. The STT-MTJ device 104 includes the bottom electrode 112, the top electrode 122, and the pMTJ 105 disposed therebetween that includes the pinned layer 106, the free layer 108, and the tunnel barrier 110 disposed therebetween. Because the pinned layer 106 generates a magnetic field that may affect, or "bias," a magnetic orientation of the free layer 108, the pinned layer 106 includes a synthetic anti-ferromagnetic (SAF) structure 200, wherein the pinned layer 106 includes a bottom SAF layer 202, a top SAF layer 204 and an anti-ferromagnetically coupled (AFC) spacer layer 206 therebetween, a reference layer 208 which is a polarization enhancing layer, and a seed layer 210. This magnetic field bias, at best, can cause an asymmetry in the magnitude of current necessary to change the magnetic orientation of the free layer 108 (i.e., $I_{P-AP}$ is different than $I_{AP-P}$). These bottom and top SAF layers 202, 204 are permanently magnetized and magnetically coupled in opposite orientations to generate opposing magnetic fields. The opposite magnetic fields produce a zero or near-zero net magnetic field towards the free layer 108, thus reducing the magnetic field bias problem at the free layer 108. To achieve a higher tunnel magneto-resistance (TMR) ratio in the pMTJ 105, it is important to have a good epitaxial interface between the free layer 108 and the tunnel barrier 110 so that the magnetization of the free layer 108 will not be in-plane due to the magnetization effect.

Though STT-MRAM devices like the STT-MTJ device 104 in FIGS. 1 and 2 have shown promise for providing unified memory for low-power processor-based applications, STT-MRAM devices may not be fast and low-power enough to directly replace SRAM for high-performance computing applications (e.g., high-level caches). Furthermore, fast STT-MRAM switching may suffer from penalties in read performance, cycling endurance, or data retention.

Spin-orbit torque (SOT) can assist MTJ switching and reduce switching energy, increase speed, and increase endurance over STT-MRAM. SOT-MRAM is a design to take advantage of the highly efficient spin-torque generation from SOT materials due to the spin hall effect (SHE). FIG. 3 is a schematic diagram of a SOT-MTJ device 300 illustrating the SHE inducing spin accumulation at a heavy metal, ferromagnetic material interface. The SOT-MTJ device 300 includes a top electrode 302 and a bottom electrode 304, with a MTJ 306 formed therebetween. The MTJ 306 include a free ferromagnetic layer ("free layer") 308 disposed above the bottom electrode 304, a tunnel barrier 310 disposed above the free layer 308, and a pinned ferromagnetic layer ("pinned layer") 312 disposed above the tunnel barrier 310. With the SOT-MTJ device 300, a current I is directed to flow in-plane in the bottom electrode 304 provided as a heavy metal material (e.g., having high atomic weight, such as Platinum (Pt), Tantalum (Ta), or Tungsten (W)) adjacently disposed to the free layer 308. A spin torque $J_{SHE}$ is generated by the spin-orbit coupling between the bottom electrode 304 and the free layer 308 due to the SHE as a result of the current I flowing in-plane in the bottom electrode 304. Thus, the current flowing through the MTJ 306 is reduced for switching, which can improve the endurance of the tunnel barrier 310. This is shown by example in the graph 400 in FIG. 4 that illustrates processional switching of the free layer 108 in the STT-MTJ device 104 in FIG. 2 versus the switching of the free layer 308 of the SOT-MTJ device 300 in FIG. 3. As shown therein, the current Ic required to switch the free layer 308 of the SOT-MTJ device 300 is less than the current Ic required to switch the free layer 108 of the STT-MTJ device 104 for a given amount of switching time τ.

With reference back to FIG. 3, the spin torque $J_{SHE}$ generated by the current I flowing through the bottom electrode 304 in the SOT-MTJ device 300 is sufficient to switch the magnetic moment of the free layer 308 from a perpendicular orientation (as shown) to ninety (90) degrees to be in-plane. However, the magnetic moment of the in-plane orientation is in an unstable magnetic state in the SOT-MTJ device 300 because of the perpendicular anisotropy of the free layer 308. Thus, after the current I is removed, the magnetic moment of the free layer 308 in the SOT-MTJ device 300 will switch back to either an up direction in the Z-axis direction (i.e., in a zero (0) degree direction), or a down direction in the Z-axis direction (i.e., in a one hundred eighty (180) degree direction) due to the perpendicular anisotropy of its free layer 308. The probability of the magnetic moment of the free layer 308 switching back from an in-plane magnetic orientation to either an up or down perpendicular magnetic orientation is approximately 50% each creating a non-deterministic switching for a write operation. To provide for deterministic switching in the SOT-MTJ device 300, an external magnetic field can be applied to the free layer 308 of the MTJ 306 during a switching operation to assist the magnetic moment of the free layer 308 to switch past an in-plane magnetic orientation to either a zero (0) degree or one hundred eighty (180) degrees perpendicular magnetic orientation depending on the direction of the external magnetic field or the direction of the in-plane current I. However, application of an external magnetic field may be difficult or not feasible to provide for certain applications of the SOT-MTJ device 300.

SUMMARY OF THE DISCLOSURE

Aspects disclosed herein include spin-orbit torque (SOT) magnetic tunnel junction (MTJ) (SOT-MTJ) devices employing perpendicular and in-plane free layer magnetic anisotropy to facilitate perpendicular magnetic orientation switching. A SOT-MTJ device facilitates SOT switching to reduce switching energy, increase switching speed, and increase endurance of the MTJ in the SOT-MTJ device. In one example, a free layer in a MTJ in the SOT-MTJ device includes both a perpendicular magnetic anisotropy (PMA) region(s) and an in-plane magnetic anisotropy (IMA) region(s). The PMA region(s) in the free layer of the SOT-MTJ device provides for the free layer of the MTJ to have a magnetic anisotropy. A spin torque can be generated in the free layer of the MTJ by directing a SOT switching current to flow through an electrode adjacent to the free layer sufficient to switch the magnetic moment of the free layer from a perpendicular magnetic orientation to an in-plane magnetic orientation. To prevent the in-plane magnetic orientation from returning to a non-deterministic perpendicular magnetic orientation (e.g., either zero (0) or one hundred eighty (180) degrees), after the SOT switching current is removed, the free layer of the MTJ also includes the IMA region(s) to provide an in-plane magnetization in the MTJ to generate an effective magnetic field in the free layer. This magnetic field assists in switching the magnetic moment of the free layer past an in-plane magnetic orientation to a perpendicular magnetic orientation in response to application of the SOT switching current to achieve deterministic switching for the SOT-MTJ device. Thus, as an example, an external magnetic field may not be required to be applied to the free layer of the MTJ during a switching operation to switch the magnetic orientation to a perpendicular magnetic orientation to achieve deterministic switching for the SOT-MTJ device. This mixture of PMA and IMA regions in the free layer of a SOT-MTJ device can achieve high-speed switching like a static random access memory (SRAM) device, yet the SOT-MTJ device can still be a non-volatile memory device for data retention over power cycles.

In certain examples disclosed herein, to provide for the free layer of a MTJ in a SOT-MTJ device to include both a PMA region(s) and an IMA region(s), a portion of the free layer can be modified during fabrication processes. For example, the free layer can be patterned as an eye-shaped structure having a PMA. A portion of the free layer/tunnel barrier interface in the MTJ can be modified, such as by milling or etching for example, to weaken or remove the PMA in the modified portions of the free layer. This can create an IMA region(s) in modified portions of the free layer such that the free layer includes both a PMA region(s) and an IMA region(s). Creating the IMA region(s) in the free layer of the MTJ in the SOT-MTJ device effectively produces an in-plane magnetization in the modified area of the free layer of the MTJ in the SOT-MTJ device such that the free layer has a portion with a PMA having a perpendicular magnetization and a portion with an IMA having an in-plane magnetization. In the example of the free layer patterned as an eye-shaped structure, the IMA regions(s) can be shaped on outer portions of the free layer along its long axis to align the in-plane magnetization along the long axis of the free layer.

In this regard in one exemplary aspect, a MTJ device comprising a MTJ is provided. The MTJ comprises a tunnel barrier disposed above a substrate. The MTJ also comprises a pinned layer comprising a ferromagnetic material having a fixed PMA, the pinned layer disposed adjacent to a first side of the tunnel barrier. The MTJ also comprises a free layer comprising a ferromagnetic material disposed adjacent to a second side of the tunnel barrier opposite of the first side of the tunnel barrier. The free layer comprises at least one PMA region having a free magnetization in a perpendicular orientation to the substrate, and at least one IMA region having a fixed magnetization in an in-plane orientation to the substrate.

In another exemplary aspect, a method of fabricating a MTJ device is provided. The method comprises forming a free layer comprising a ferromagnetic material having a PMA region having a free magnetization. The method also comprises forming a tunnel barrier in contact with the free layer. The method also comprises removing a portion of the PMA region in the free layer to form at least one IMA region in the free layer having a fixed magnetization in an in-plane orientation to the substrate.

In another exemplary aspect, a magneto-resistive random access memory (MRAM) bit cell is provided. The MRAM bit cell comprises an access transistor comprising a gate coupled to a word line, a source, and a drain. The MRAM bit cell also comprises a SOT-MTJ device. The SOT-MTJ device comprises a bottom electrode comprised of a metal material disposed above a substrate. The SOT-MTJ device also comprises a top electrode comprised of a metal material disposed above the bottom electrode. The SOT-MTJ device also comprises a MTJ. The MTJ comprises a tunnel barrier disposed above the substrate. The MTJ also comprises a pinned layer comprising a ferromagnetic material having a fixed PMA, the pinned layer disposed adjacent to a first side of the tunnel barrier. The MTJ also comprises a free layer comprising a ferromagnetic material disposed adjacent to a second side of the tunnel barrier opposite of the first side of the tunnel barrier. The free layer comprises at least one PMA region having a free magnetization in a perpendicular orientation to the substrate, and at least one IMA region having a fixed magnetization in an in-plane orientation to the substrate. An electrode among the bottom electrode or the top electrode is coupled to the source or the drain of the access transistor, and the other electrode among the bottom electrode or the top electrode is coupled to a bit line. The electrode among the bottom electrode or the top electrode is configured to receive an in-plane current flowing in-plane to the bottom electrode in response to a write signal applied to the word line indicating a write active state to cause the access transistor to be activated, to generate a SOT to induce spin accumulation at an interface between the bottom electrode and the free layer to switch the magnetization of the free layer to an in-plane orientation. The at least one IMA region of the free layer of the MTJ induces a magnetic field in the free layer to assist in the switching of the magnetization of the at least one PMA region in the free layer to the perpendicular orientation in response to the in-plane current.

BRIEF DESCRIPTION OF THE FIGURES

FIGS. 5A and 5B are schematic diagrams illustrating respective side and cross-sectional top views of an exemplary SOT-MTJ device employing a free layer having both a perpendicular magnetic anisotropy (PMA) region(s) and an in-plane magnetic anisotropy (IMA) region(s) to facilitate SOT switching of magnetic orientation without the requirement for an applied external magnetic field, wherein the SOT-MTJ device is suitable to be employed in memory bit cells in a memory system for storing data;

FIG. 5C is a schematic diagram of an exemplary cross-section of the free layer in the SOT-MTJ device in FIG. 5A to further illustrate exemplary PMA and IMA regions in the free layer of the SOT-MTJ device in FIG. 5A;

DETAILED DESCRIPTION

Figure 1:
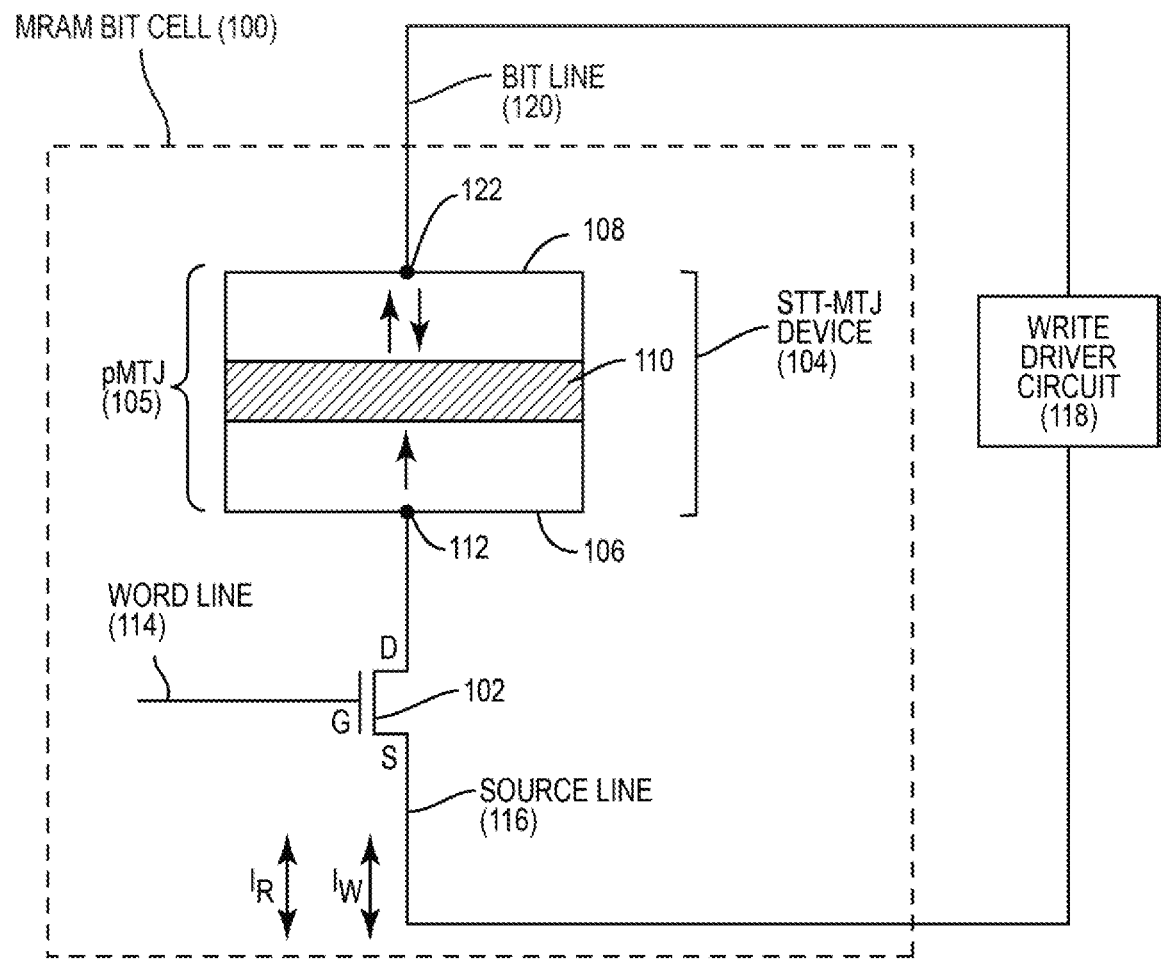
FIG. 1 is a diagram of an exemplary magneto-resistive random access memory (MRAM) bit cell employing a perpendicular spin-torque-transfer (STT) magnetic tunnel junction (MTJ) (STT-MTJ) device.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include spin-orbit torque (SOT) magnetic tunnel junction (MTJ) (SOT-MTJ) devices employing perpendicular and in-plane free layer magnetic anisotropy to facilitate perpendicular magnetic orientation switching. A SOT-MTJ device facilitates SOT switching to reduce switching energy, increase switching speed, and increase endurance of the MTJ in the SOT-MTJ device. In one example, a free layer in a MTJ in the SOT-MTJ device includes both a perpendicular magnetic anisotropy (PMA) region(s) and an in-plane magnetic anisotropy (IMA) region(s). The PMA region(s) in the free layer of the SOT-MTJ device provides for the free layer of the MTJ to have a magnetic anisotropy. A spin torque can be generated in the free layer of the MTJ by directing a SOT switching current to flow through an electrode adjacent to the free layer sufficient to switch the magnetic moment of the free layer from a perpendicular magnetic orientation to an in-plane magnetic orientation. To prevent the in-plane magnetic orientation from returning to a non-deterministic perpendicular magnetic orientation (e.g., either zero (0) or one hundred eighty (180) degrees), after the SOT switching current is removed, the free layer of the MTJ also includes the IMA region(s) to provide an in-plane magnetization in the MTJ to generate an effective magnetic field in the free layer. This magnetic field assists in switching the magnetic moment of the free layer past an in-plane magnetic orientation to a perpendicular magnetic orientation in response to application of the SOT switching current to achieve deterministic switching for the SOT-MTJ device. Thus, as an example, an external magnetic field may not be required to be applied to the free layer of the MTJ during a switching operation to switch the magnetic orientation to a perpendicular magnetic orientation to achieve deterministic switching for the SOT-MTJ device. This mixture of PMA and IMA regions in the free layer of a SOT-MTJ device can achieve high-speed switched like a static random access memory (SRAM) device, yet the SOT-MTJ device can still be a non-volatile memory device for data retention over power cycles.

In certain examples disclosed herein, to provide for the free layer of a MTJ in a SOT-MTJ device to include both a PMA region(s) and an IMA region(s), a portion of the free layer can be modified during fabrication processes. For example, the free layer can be patterned as an eye-shaped structure having a PMA. A portion of the free layer/tunnel barrier interface in the MTJ can be modified, such as by milling or etching for example, to weaken or remove the PMA in the modified portions of the free layer. This can create an IMA region(s) in modified portions of the free layer such that the free layer includes both a PMA region(s) and an IMA region(s). Creating the IMA region(s) in the free layer of the MTJ in the SOT-MTJ device effectively produces an in-plane magnetization in the modified area of the free layer of the MTJ in the SOT-MTJ device such that the free layer has a portion with a PMA having a perpendicular magnetization and a portion with an IMA having an in-plane magnetization. In the example of the free layer patterned as an eye-shaped structure, the IMA regions(s) can be shaped on outer portions of the free layer along its long axis to align the in-plane magnetization along the long axis of the free layer.

In this regard, FIGS. 5A and 5B are schematic diagrams illustrating respective side and cross-sectional top views of an exemplary SOT-MTJ device 500 employing a free magnetization layer 502 ("free layer 502") having both a PMA region 504 and an IMA region 506 to facilitate SOT switching of magnetic orientation without the need for an applied external magnetic field. The SOT-MTJ device 500 is suitable to be employed in memory bit cells in a memory system for storing data. As shown in the side view of the SOT-MTJ device 500 in FIG. 5A, the SOT-MTJ device 500 is formed on or above a substrate 508. The SOT-MTJ device 500 includes a bottom electrode 510 formed of a metal material, a top electrode 512 also formed of a metal material, and an MTJ 514 formed therebetween and coupled to the bottom electrode 510 and the top electrode 512. The bottom electrode 510 is disposed above and in contact with the substrate 508 in this example. The MTJ 514 is disposed above and in contact with the bottom electrode 510. The MTJ 514 in this example includes a pinned magnetization layer 516 ("pinned layer") that is a ferromagnetic material disposed above and in contact with the bottom electrode 510. The pinned layer 516 in this example has a fixed PMA that is perpendicular to the substrate 508. A tunnel barrier 518 of a dielectric material (e.g., Manganese Oxide (MgO)) is disposed above the substrate 508 and the pinned layer 516 and in contact with the pinned layer 516 such that the pinned layer 516 is disposed adjacent to a first side 520 of the tunnel barrier 518. The free layer 502 comprised of a ferromagnetic material is disposed adjacent to and in contact with a second side 522 of the tunnel barrier 518 opposite of the first side 520 of the tunnel barrier 518. The top electrode 512 is disposed above and in contact with the free layer 502. A hard mask 524 may be left above the top electrode 512 as a remnant of a fabrication process where the MTJ 514 is protected during an etching process to etch materials to form the layers of the MTJ 514, such as an ion-beam etching (IBE) process.

With continuing reference to FIGS. 5A and 5B, the free layer 502 of the MTJ 514 in this example includes a free PMA region 504 having a free magnetization in a perpendicular orientation to the substrate 508. The PMA region 504 in the free layer 502 allows for the magnetic moment of the free layer 502 to be switched in a perpendicular direction for a more deterministic memory state as a function of the difference in resistance between parallel (P) and anti-parallel (AP) magnetic orientations with the magnetization of the pinned layer 516. The spin torque generated by a SOT switching current $I_S$ flowing in-plane through the top electrode 512 is sufficient to switch the magnetic moment of the free layer 502 from a perpendicular orientation ninety (90) degrees to an in-plane orientation. However, when the SOT switching current $I_S$ is removed, the magnetic moment of the free layer 502 will return back to a perpendicular orientation. However, the magnetic moment of the free layer 502 will return back to a perpendicular orientation that is non-deterministic meaning not reliably repeatable. Thus, after the SOT switching current $I_S$ is removed, the free layer 502 could be in either a P or AP orientation to the magnetic orientation of the pinned layer 516 representing either a logic '0' or logic '1' thus making the write operation non-deterministic. An external magnetic field could be applied to the free layer 502 of the MTJ 514 during a switching operation to assist the magnetic moment of the free layer 502 to switch past an in-plane magnetic orientation to a deterministic zero (0) degree or one hundred eighty (180) perpendicular magnetic orientation depending on the direction of the SOT switching current $I_S$. However, application of an external magnetic field may be difficult or not feasible to provide for certain applications of the SOT-MTJ device 500.

Thus, in the SOT-MTJ device 500 in FIG. 5A, to assist the switching of the magnetic moment of the free layer 502 from an in-plane magnetic orientation to a perpendicular magnetic orientation in a deterministic manner, the free layer 502 in the MTJ 514 of the SOT-MTJ device 500 also includes the IMA region 506. The IMA region 506 has a fixed magnetization in an in-plane orientation to the substrate 508. This is shown in FIG. 5A and also in the cross-sectional top view of the free layer 502 in the SOT-MTJ device 500 in FIGS. 5B and 5C. As shown in FIG. 5C, the PMA region 504 of the free layer 502 has a perpendicular magnetic orientation. IMA regions 506(1), 506(2) in the free layer 502 provide an in-plane magnetization in the MTJ 514 to generate an effective magnetic field in the free layer 502 to assist in switching the magnetic moment of the free layer 502 from an in-plane magnetic orientation to a deterministic perpendicular magnetic orientation when the SOT switching current $I_S$ is applied. The IMA regions 506(1), 506(2) provide an in-plane magnetization to generate an effective magnetic field in the free layer 502 to assist in switching the magnetic moment of the free layer 502 past an in-plane magnetic orientation when the SOT switching current $I_S$ is applied to a deterministic perpendicular magnetic orientation. The perpendicular magnetic orientation either being up or down in the orientation of FIG. 5A is controlled by the direction of the SOT switching current $I_S$ assuming a fixed direction of magnetization of the IMA regions 506(1), 506(2). This also applies to a top-pinned SOT MTJ device discussed below as well as the bottom pinned SOT-MTJ device 500 in FIGS. 5A-5C.

Thus, as an example figure, an external magnetic field to generate a magnetic field in the free layer 502 may not be required to achieve a perpendicular magnetic orientation. This mixture of the PMA region 504 and the IMA region 506 in the free layer 502 of the SOT-MTJ device 500 can achieve high-speed switching like a static random access memory (SRAM) device, yet the SOT-MTJ device 500 can still be a non-volatile memory device for data retention over power cycles.

As shown in FIG. 5B, in this example, the free layer 502 of the MTJ 514 has a PMA region 504 and IMA regions 506(1), 506(2) that form an eye-shaped structure 526 to provide a shape anisotropy in the free layer 502 for the IMA regions 506(1), 506(2). The shape anisotropy of the free layer 502 in the IMA regions 506(1), 506(2) is the anisotropy associated with the shape of the free layer 502. In this regard, the free layer 502 has an elongated shape that has a long axis $LA_1$ and a short axis $SA_1$. The shape anisotropy in the free layer 502 creates a favorable energy for magnetization in the free layer 502 in the direction of the long axis $LA_1$ and an unfavorable energy for magnetization in the free layer 502 in the direction of the short axis $SA_1$. In this example, the PMA region 504 is an inner circular-shaped region 528 of the eye-shaped structure 526 having a center $C_1$. The IMA regions 506(1), 506(2) are formed on adjacent sides 530(1), 530(2) to the PMA region 504 in the direction of the long axis $LA_1$ to align the in-plane magnetization of the IMA regions 506(1), 506(2) along the long axis $LA_1$. For example, as will be discussed in more detail below, the IMA regions 506(1), 506(2) may be formed by removing a portion of the PMA region 504 starting from the edges 532(1), 532(2) on the sides 530(1), 530(2) of the free layer 502 towards the center $C_1$ of the free layer 502 of defined respective lengths $L_1$, $L_2$. This may be relatively easy to achieve during the fabrication of the SOT-MTJ device 500 since the substrate 508 may be rotated during etching of the material layers to form the MTJ 514. The direction of magnetization in the IMA regions 506(1), 506(2) can be set by applying an external field after the patterning. In this example, the IMA regions 506(1), 506(2) are disposed adjacent to the PMA region 504 along the long axis $LA_1$ in a cross-section of the free layer 502 along line $A_1$-$A_1$, along a plane substantially parallel to the substrate 508. In this example, a ratio of a diameter $D_1$ of the PMA region 504 along the long axis $LA_1$ to a diameter $D_2$ of the overall eye-shaped structure 526 that includes the IMA regions 506(1), 506(2) may be between approximately 0.4 and 0.8 to achieve the desired ratio of PMA and IMA in the free layer 502.

With continuing reference to FIG. 5A, the top electrode 512 may comprise a heavy metal material, such Tantalum (Ta), Tungsten (W), Hafnium (Hf), and Platinum (Pt), to achieve the desired spin torque generated by the spin-orbit coupling between the top electrode 512 to the free layer 502 as a result of the in-plane SOT switching current $I_S$. The pinned layer 516 may also be a metal material from at least one of a Cobalt (Co), Platinum (Pt), Nickel (Ni), Palladium (Pd), and Hafnium (Hf) material. For example, the pinned layer 516 may be material comprising at least one of a Co/Nickel (Ni) alloy, a Co/Pd alloy, an Iron (Fe)/Boron (B) alloy, a Co/Pt alloy, a Gadolinium (Gd)/Fe alloy, a Co/Fe alloy, a Co/Fe/B alloy, or a Ta/Fe/Co alloy. The free layer 502 may also be a material that includes at least one of a Co, Fe, and B material.

Figure 6:
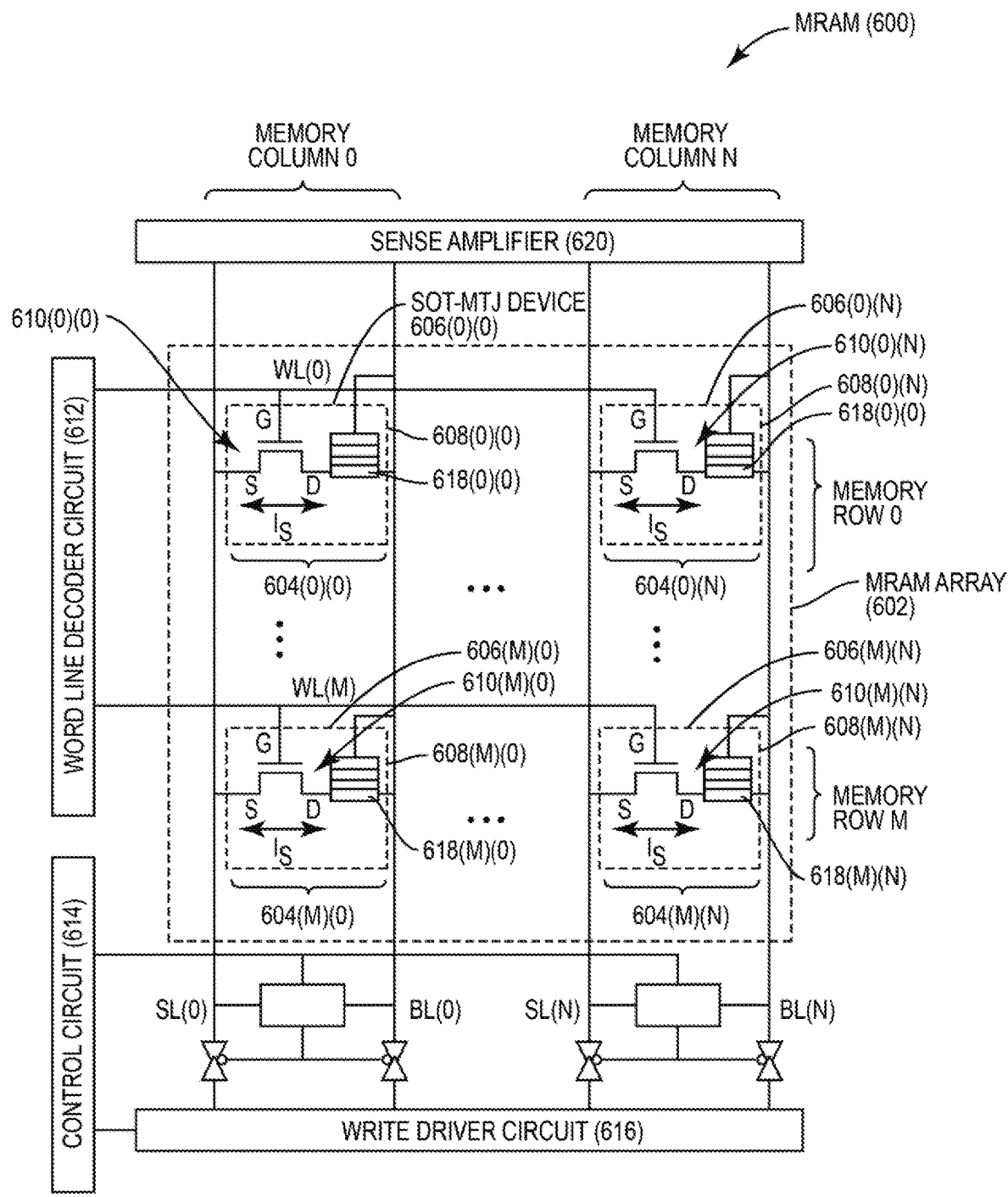
FIG. 6 is a schematic diagram of an exemplary MRAM that includes an MRAM array comprising a plurality of MRAM bit cells organized in rows and columns and supporting access circuitry for accessing the MRAM bit cells, wherein the MRAM bit cells can each include a SOT-MTJ device employing a free layer having both PMA and IMA regions to facilitate SOT switching of magnetic orientation, including, but not limited to, the SOT-MTJ device in FIG. 5A.

FIG. 6 illustrates an exemplary MRAM 600 that includes an MRAM array 602 that includes a plurality of MRAM bit cells 604(0)(0)-604(M)(N) organized in memory rows 0-M and memory columns 0-N, wherein each of the MRAM bit cells 604(0)(0)-604(M)(N) can each include a SOT-MTJ device 606(0)(0)-606(M)(N) employing a respective MTJ 608(0)(0)-608(M)(N) that includes a free layer having both PMA and IMA regions to facilitate SOT switching of magnetic orientation, including, but not limited to, the SOT-MTJ device 500 in FIGS. 5A and 5B. In this example, each MRAM bit cell 604(0)(0)-604(M)(N) includes an MTJ 608(0)(0)-608(M)(N) coupled to an access transistor 610(0)(0)-610(M)(N). In this example, the access transistors 610(0)(0)-610(M)(N) each include a gate G that is coupled to a respective word line WL(0)-WL(M) that is associated with a respective memory row 0-M. The access transistors 610

(0)(0)-610(M)(N) also each include a source and drain. Either the bottom electrode 510 or top electrode 512 (see FIG. 5A) is coupled to either the source S or the drain D of a respective access transistor 610(0)(0)-610(M)(N) to direct the SOT switching current $I_S$ in-plane to the SOT-MTJ device 500. Either the bottom electrode 510 or top electrode 512 that is not coupled to a respective access transistor 610(0)(0)-610(M)(N) is coupled to a respective bit line BL(0)-BL(N). The access transistors 610(0)(0)-610(M)(N) for each MRAM bit cell 604(0)(0)-604(M)(N) are coupled to respective word lines WL(0)-WL(M) that are associated with a respective memory row 0-M. A word line decoder circuit 612 is provided in the MRAM 600 and is configured to decode a memory address for a memory read or write operation to assert a word line signal on the word line WL(0)-WL(M) associated with the memory row 0-M of the memory address to activate the MRAM bit cells 604(0)(0)-604(M)(N) in the selected memory row 0-M for the write operation. When a memory row 0-M of the MRAM bit cells 604(0)( )-604(M)( ) is selected by the word line decoder circuit 612, the SOT-MTJ devices 606(0)( )-606(M)( ) of the MRAM bit cells 604(0))-604(M)( ) in the selected memory row 0-M are coupled between a respective source line SL(0)-SL(N) and a bit line BL(0)-BL(N) in the memory columns 0-N.

With continuing reference to FIG. 6, for a write operation, a control circuit 614 controls a write driver circuit 616 to activate the respective access transistors 610(0)( )-610(M)( ) for the memory row 0-M of MRAM bit cells 604(0)( )-604(M)( ) being written to assert the SOT switching current $I_S$ in-plane to a bottom electrode 618(0)( )-618(M)( ) of the SOT-MTJ device 606(0)( )-606(M)( ) of the MRAM bit cells 604(0)( )-604(M)( ). This causes a respective SOT switching current $I_S$ flowing in-plane through the bottom electrodes 618(0)( )-618(M)( ) of the SOT-MTJ devices 606(0)( )-606(M)( ) being written in the selected memory row 0-M, to switch the magnetic orientation (i.e., direction) of their free layers to a magnetization state of the memory state to be written according to the write operation. As previously discussed, the IMA region(s) in the free layer of the MTJs 608(0)( )-608(M)( ) being written induces a magnetic field such that the magnetization state of the free layer is a perpendicular magnetic orientation either parallel (P) or anti-parallel (AP) to the magnetic orientation of the pinned layers of the respective MTJs 608( )(0)-608( )(N) to represent logic '0' and '1', respectively. The direction of the SOT switching current $I_S$ controls whether the respective MTJs 608( )(0)-608( )(N) in the selected memory row 0-M are switched to a P or AP memory state.

For a read operation, a sense amplifier 620 asserts a read voltage differential between the source lines SL(0)-SL(N) and their corresponding bit lines BL(0)-BL(N) of the respective SOT-MTJ devices 6060(0)-606( )(N) in the selected memory row 0-M to be read. This causes a respective read current to flow through the respective MTJs 608( )(0)-608( )(N) in the selected memory row 0-M between the respective source lines SL(0)-SL(N) and bit lines BL(0)-BL(N) according to the resistance of the respective MTJ 608( )(0)-608( )(N), which is dependent on magnetic orientation (i.e., direction) of the free layers therein representing a stored memory state. The sense amplifier 620 senses the read current as a way to determine the resistance of the respective MTJs 608( )(0)-608( )(N) in the selected memory row 0-M for the read operation, and thus the memory state stored in the SOT-MTJ devices 606( )(0)-606( )(N).

Figure 7:
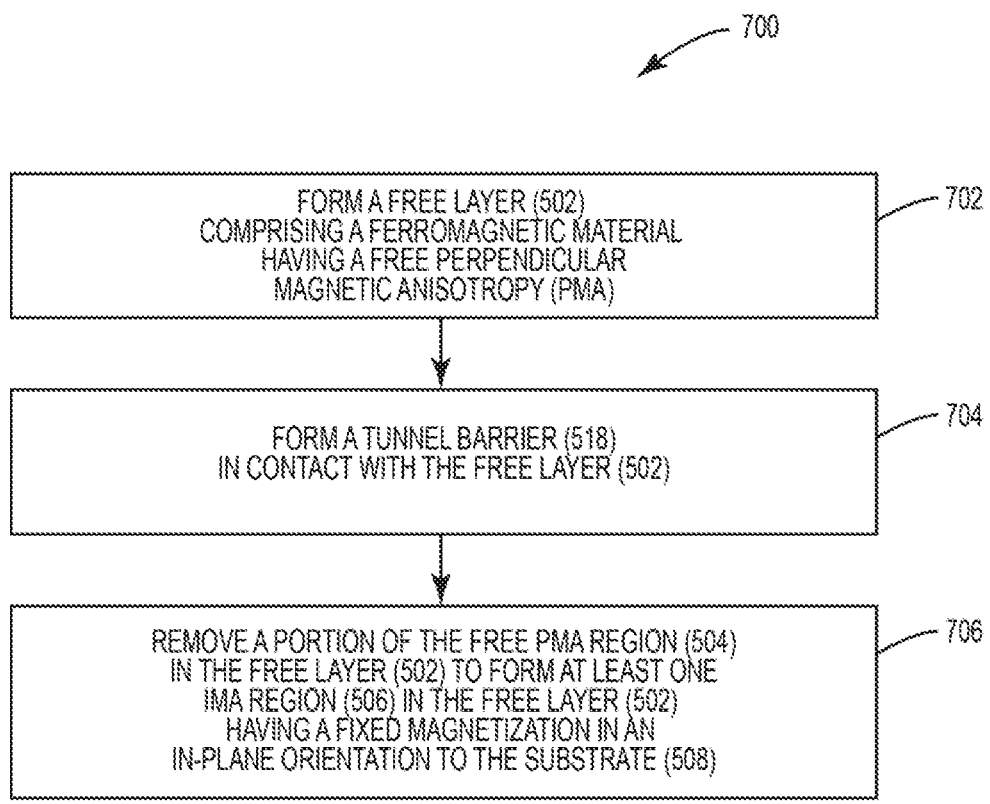
FIG. 7 is a flowchart illustrating an exemplary process of fabricating a SOT-MTJ device employing a free layer having both PMA and IMA regions to facilitate SOT switching of magnetic orientation, including, but not limited to, the SOT-MTJ device in FIG. 5A.

FIG. 7 is a flowchart illustrating an exemplary process 700 of fabricating a SOT-MTJ device employing a free layer having both PMA and IMA regions to facilitate SOT switching of magnetic orientation, including, but not limited to, the SOT-MTJ device 500 in FIG. 5A. The process 700 will be discussed referring to the SOT-MTJ device 500 in FIG. 5A as an example. In this regard, the process 700 includes forming a free layer 502 comprising a ferromagnetic material having a free PMA (block 702). The process 700 also includes forming a tunnel barrier 518 in contact with the free layer 502 (block 704). The process 700 also includes removing a portion of the free PMA region 504 in the free layer 502 to form at least one IMA region 506 in the free layer 502 having a fixed magnetization in an in-plane orientation to the substrate 508 (block 706).

An SOT-MTJ device that includes a MTJ that has a free layer having both PMA and IMA regions to facilitate SOT switching of magnetic orientation can be fabricated in different manners. For example, FIGS. 8A-8E illustrate exemplary fabrication stages of fabricating an exemplary bottom-pinned SOT-MTJ device, like the SOT-MTJ device 500 in FIG. 5A, employing a free layer having both PMA and IMA regions to facilitate SOT switching of magnetic orientation.

Figure 8A:
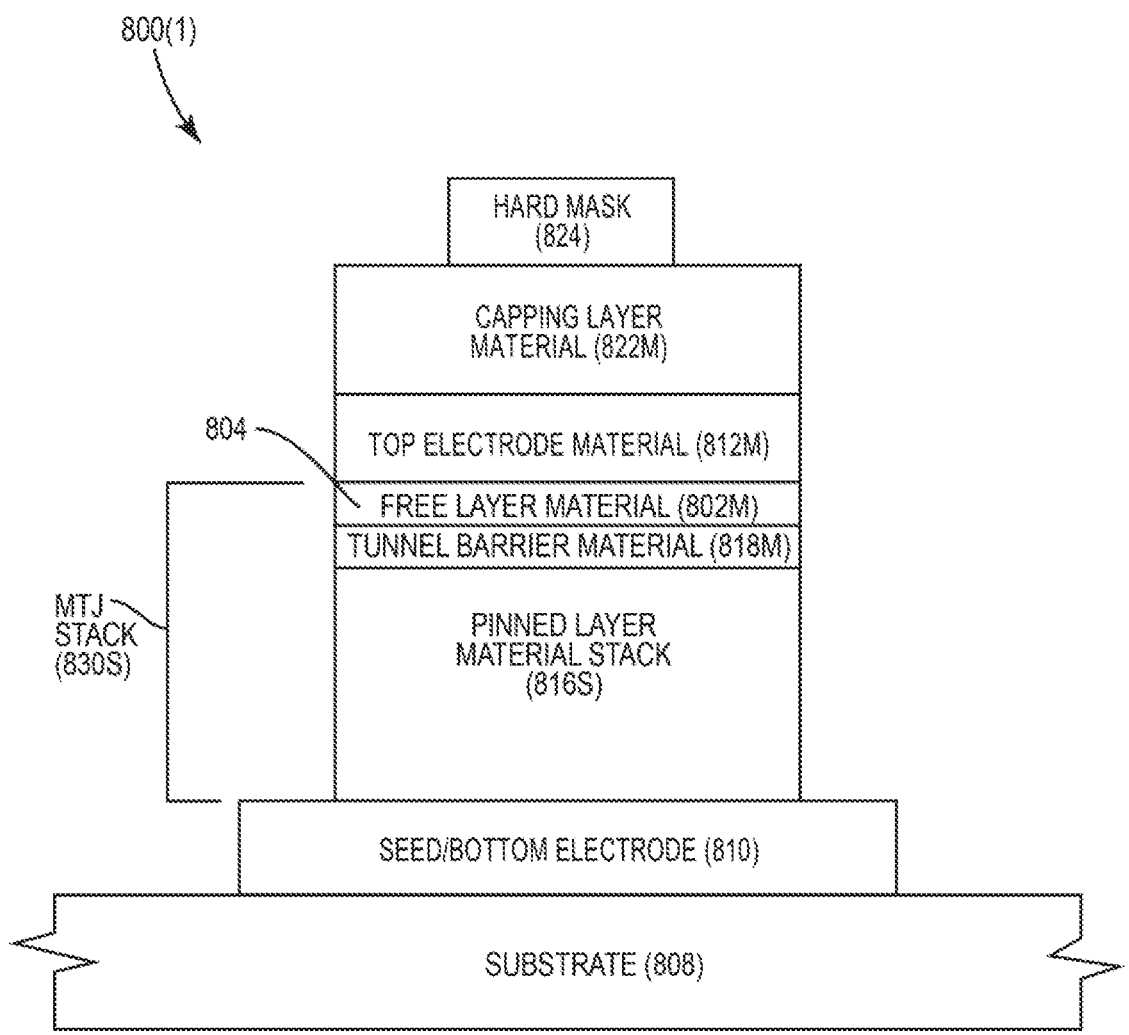
FIGS. 8A-8E illustrate exemplary fabrication stages of fabricating an exemplary bottom-pinned SOT-MTJ device employing a free layer having both PMA and IMA regions to facilitate SOT switching of magnetic orientation.

In this regard, FIG. 8A illustrates a first exemplary fabrication stage 800(1) of fabricating a SOT-MTJ device. A substrate 808 is provided. A bottom electrode 810 is formed above and on top of the substrate 808. A pinned layer material stack 816S includes one or more ferromagnetic materials having a fixed or pinned perpendicular magnetization is disposed on the bottom electrode 810. The bottom electrode 810 may also include a seed layer on which the pinned layer material stack 816S can be formed. A tunnel barrier material 818M is disposed on the pinned layer material stack 816S. A free layer material 802M of a ferromagnetic material that has a PMA such that the free layer material 802M has a free perpendicular magnetization is disposed on the tunnel barrier material 818M. The free layer material 802M, the tunnel barrier material 818M, and the pinned layer material stack 816S form a MTJ stack 830S. A top electrode material 812M comprising a metal material is formed on the free layer material 802M. A capping layer material 822M is formed on the top electrode material 812M. A hard mask 824 is disposed above the top electrode material 812M. Disposing the pinned layer material stack 816S adjacent to the substrate 808 will provide for the fabricated SOT-MTJ device to be in a bottom-pinned configuration.

The top electrode material 812M may comprise a heavy metal material, such as Ta, W, Hf, and Pt, to achieve the desired spin torque generated by the spin-orbit coupling between the top electrode material 812M and the free layer material 802M as a result of the in-plane SOT switching current $I_S$. The pinned layer material stack 816S may also be a metal material from at least one of a Co, Pt, Ni, Pd, and Hf material. For example, the pinned layer material stack 816S may be material comprising at least one of a Co/Ni alloy, a Co/Pd alloy, an Fe/B alloy, a Co/Pt alloy, a Gd/Fe alloy, a Co/Fe alloy, a Co/Fe/B alloy, or a Ta/Fe/Co alloy. The free layer material 802M may also be a material that includes at least one of a Co, Fe, and B material.

Figure 8B:
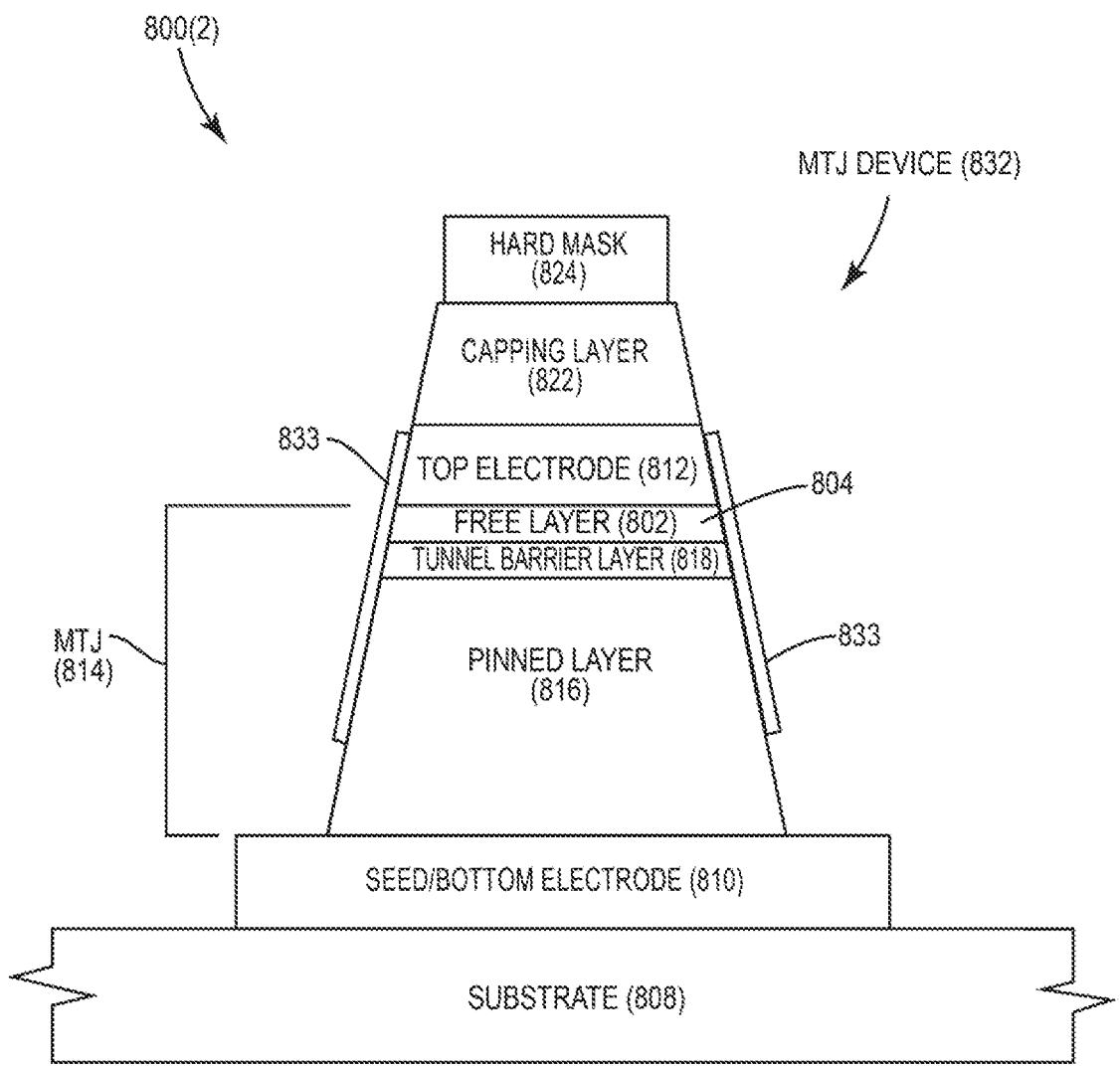
Figure 8C:
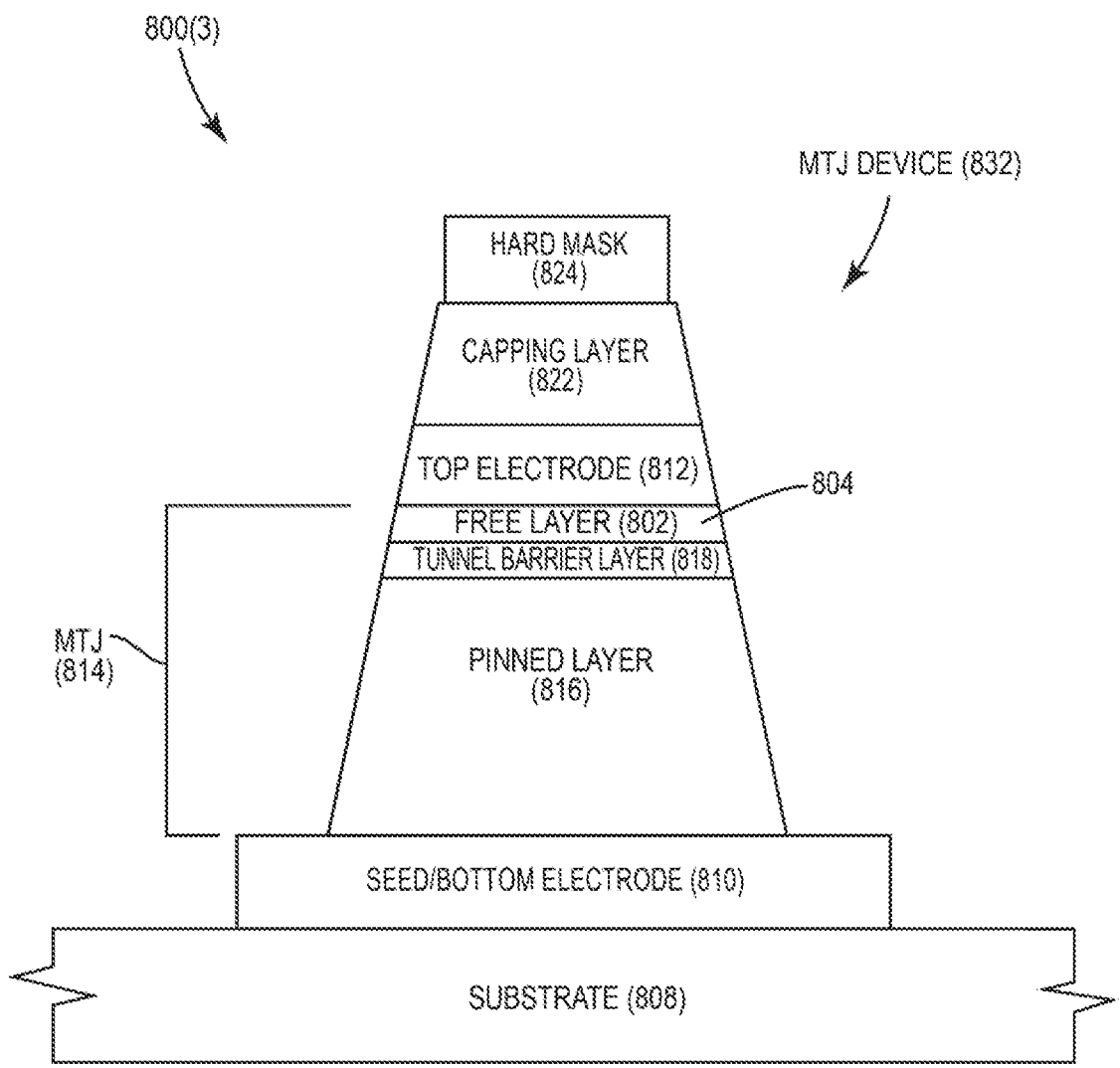

FIG. 8B illustrates a next exemplary fabrication stage 800(2) of fabricating a SOT-MTJ device. As shown therein, the MTJ stack 830S has been etched to form a MTJ device 832. The MTJ stack 830S has been etched to form a pinned layer 816, a tunnel barrier layer 818, and a free layer 802 as part of a MTJ 814 from the respective pinned layer material stack 816S, the tunnel barrier material 818M, and the free layer material 802M. A top electrode 812 is also formed from the etching of the top electrode material 812M. A capping layer 822 is also formed from the etching of the capping layer material 822M. As examples, the MTJ patterning or etching process used to form the MTJ device 832 can include IBE and chemical etching in a reactive ion etching (RIE) process. The etched material may be redeposited as redeposited material 833 on the sides of the MTJ 814. IBE may be used for etching materials that have tendencies to not react well to chemical etching. An IBE process can avoid or reduce damage zones over RIE processes, but no chemical component is involved to maintain lithography patterns and process flexibility. As shown in FIG. 8C, a next exemplary fabrication stage 800(3) of fabricating a SOT-MTJ device may be to remove the redeposited material 833 on the sides of the MTJ 814.

Figure 2:
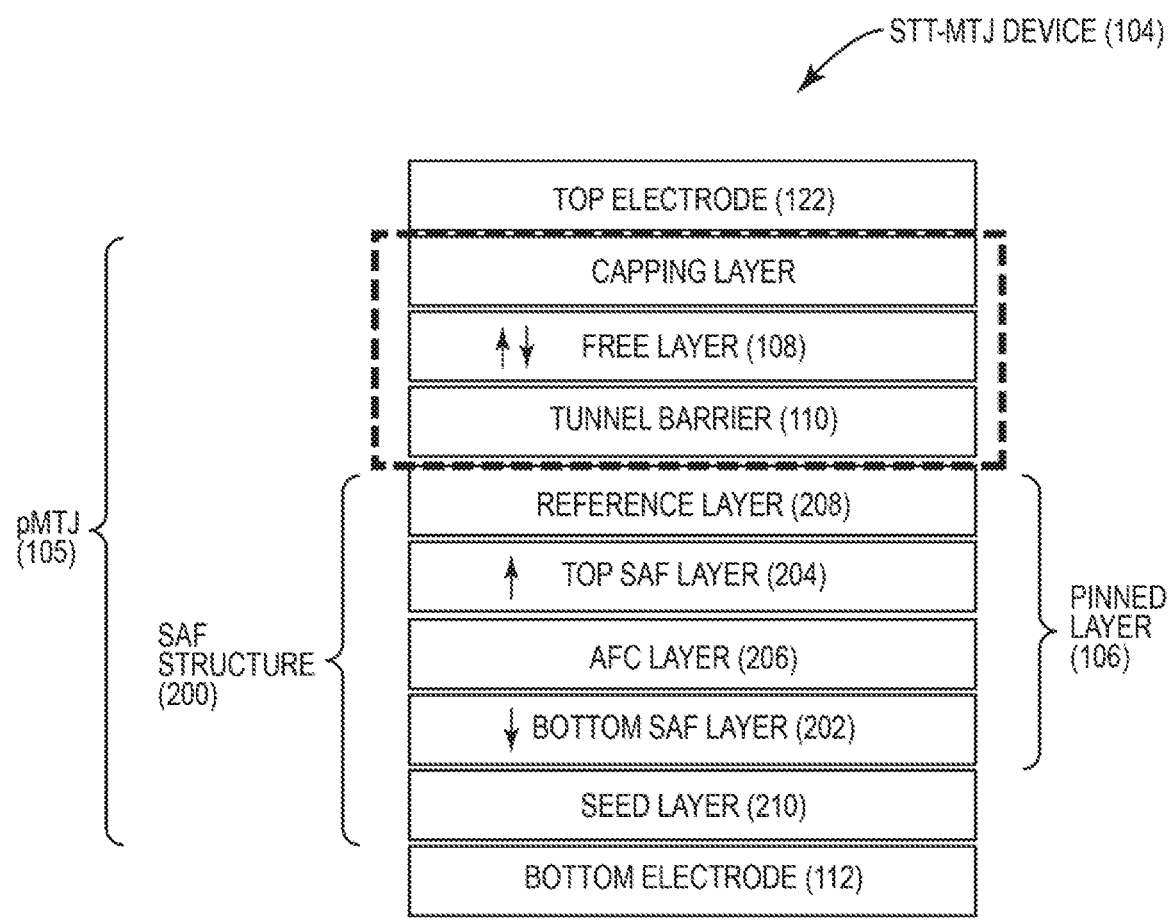
FIG. 2 is a schematic diagram of exemplary material layers forming the perpendicular STT-MTJ device in the MRAM bit cell in FIG. 1.
Figure 3:
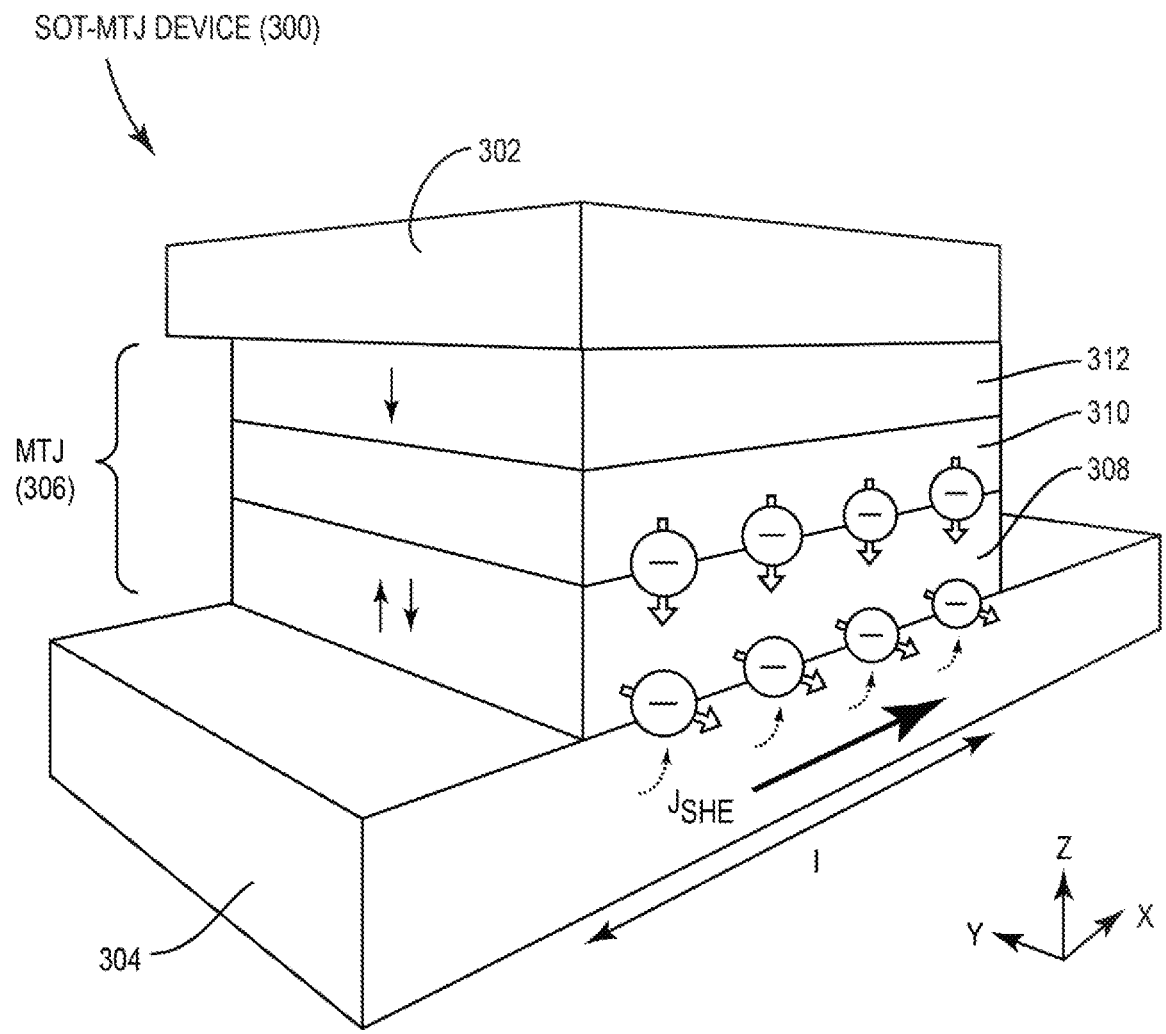
FIG. 3 is a schematic diagram of a spin-orbit torque (SOT)-MTJ device illustrating a spin hall effect (SHE) inducing spin accumulation at a heavy metal, ferromagnetic material interface.
Figure 4:
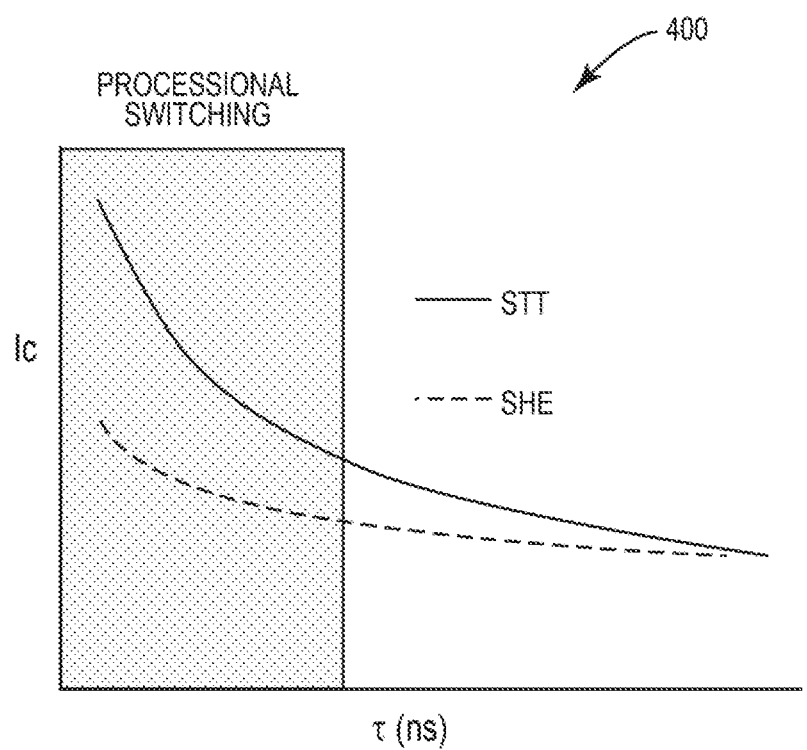
FIG. 4 is a graph illustrating processional switching of free layers in the perpendicular STT-MTJ device in FIG. 2 and the SOT-MTJ device in FIG. 3.
Figures 1, 8D:
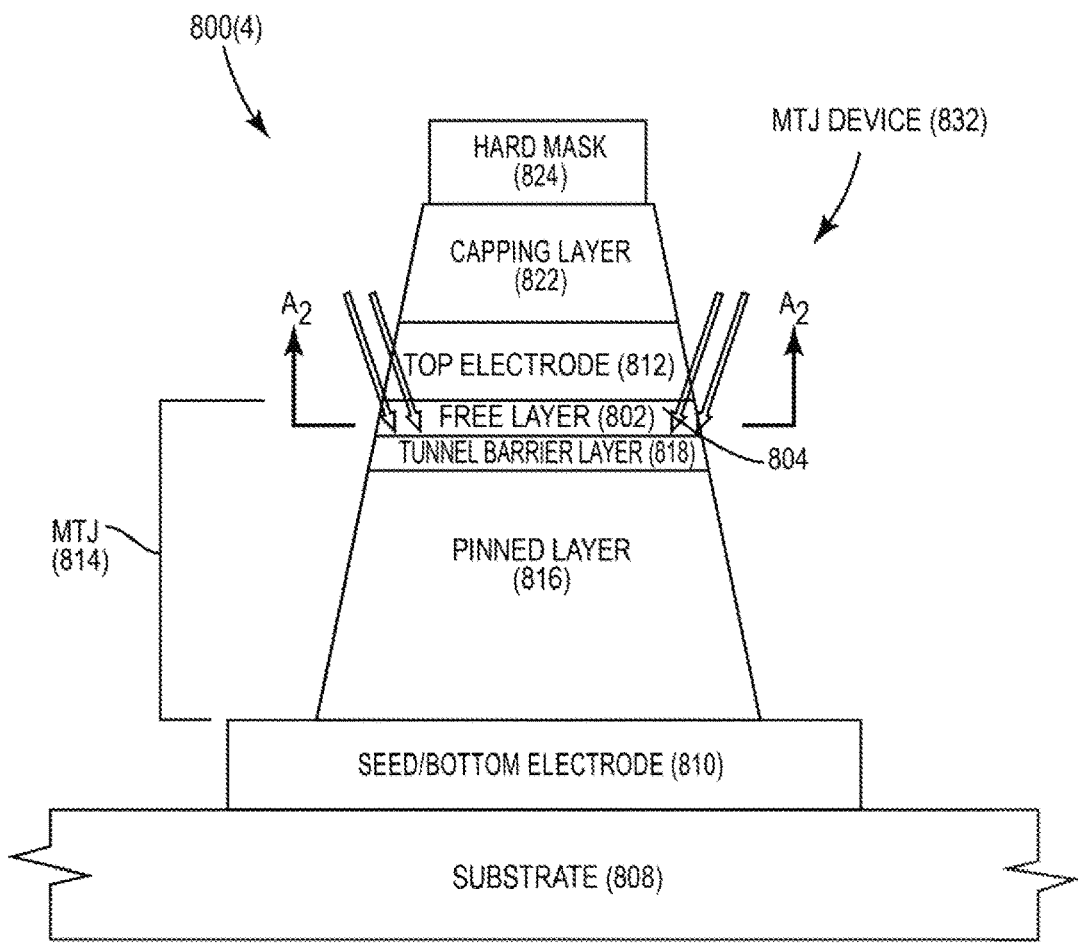
Figures 2, 8D:
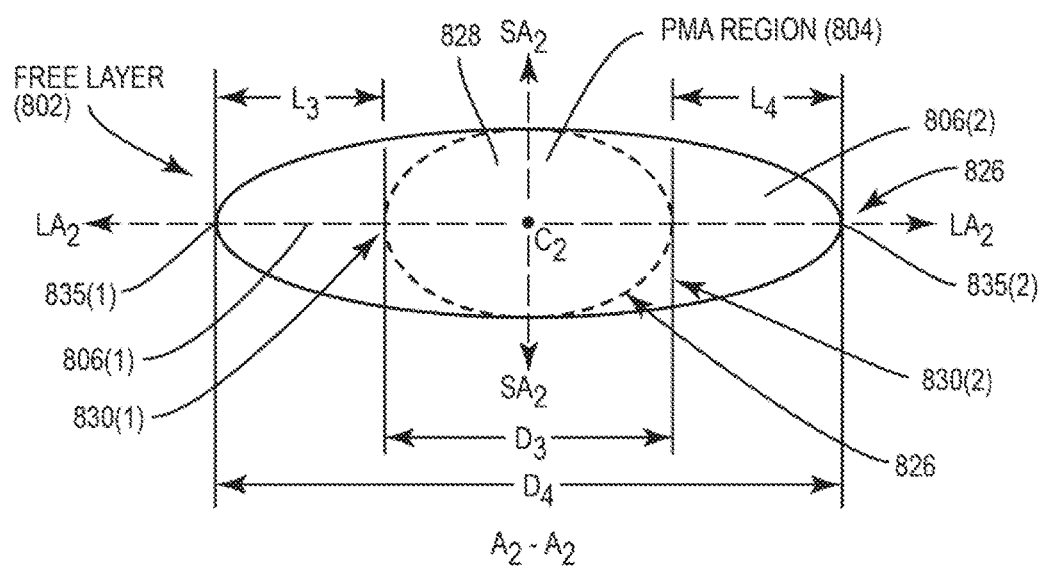
Figure 8E:
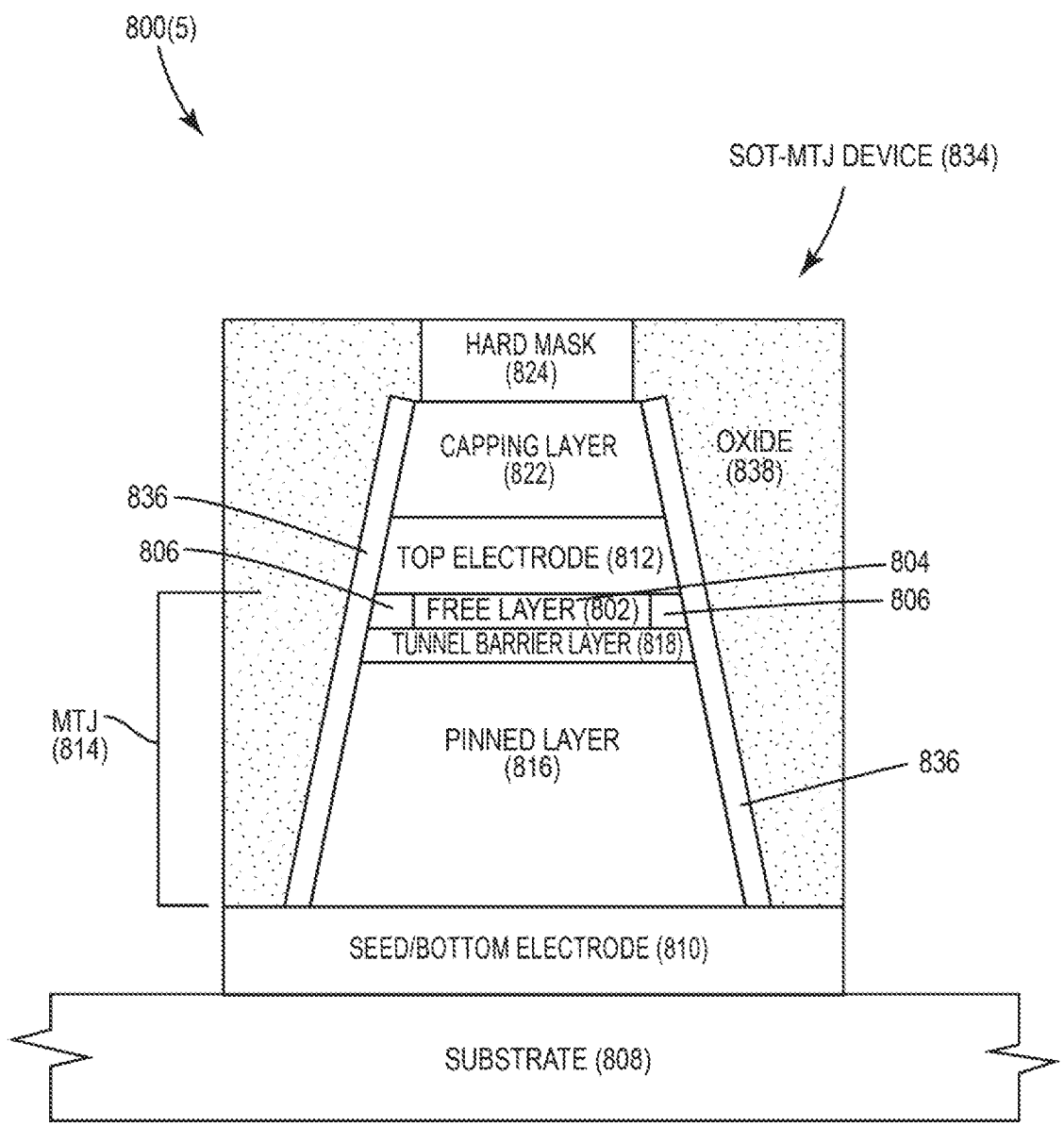

FIGS. 8D-1 and 8D-2 illustrate a next exemplary fabrication stage 800(4) of fabricating a SOT-MTJ device to provide for the free layer 802 to include both a PMA region 804 and an IMA region 806. As shown in FIG. 8D-1, the free layer 802 is etched to remove a portion of the PMA region 804 therein to form an IMA region 806 as shown in the top view cross section of the free layer 802 along line $A_2$-$A_2$ in FIG. 8D-2. A SOT-MTJ device 834 shown in a next exemplary fabrication stage 800(5) in FIG. 8E is formed. For example, the free layer 802 may be etched using an ion-milling process to remove a portion of the PMA region 804 from the free layer 802 to form the IMA region 806. As previously discussed, the PMA region 804 in the free layer 802 has a magnetic moment in a perpendicular magnetic orientation to the substrate 808. The IMA region 806 having a fixed magnetization in an in-plane orientation to the substrate 808 provides an in-plane magnetization in the MTJ 814 to generate an effective magnetic field in the free layer 802 to assist in switching the magnetic moment of the free layer 802 to a perpendicular orientation in response to a SOT switching current $I_S$ applied in-plane to the top electrode 812. Thus, as an example, an external magnetic field to generate a magnetic field in the free layer 802 may not be required to achieve a perpendicular magnetic orientation. This mixture of the PMA region 804 and the IMA region 806 in the free layer 802 of the SOT-MTJ device 834 can achieve high-speed switching like a SRAM device, yet the SOT-MTJ device 834 can still be a non-volatile memory device for data retention over a power cycle.

As shown in FIG. 8D-2, in this example, the free layer 802 of the MTJ 814 has a PMA region 804 and IMA regions 806(1), 806(2) that form an eye-shaped structure 826 to provide a shape anisotropy in the free layer 802. The shape anisotropy of the free layer 802 is the anisotropy associated with the shape of the free layer 802. In this regard, the free layer 802 has an elongated shape that has a long axis $LA_2$ and a short axis $SA_2$. The shape anisotropy in the free layer 802 creates a favorable energy for magnetization in the free layer 802 in the direction of the long axis $LA_2$ and an unfavorable energy for magnetization in the free layer 802 in the direction of the short axis $SA_2$. In this example, the PMA region 804 is an inner circular-shaped region 828 of the eye-shaped structure 826 having a center $C_2$. The IMA regions 806(1), 806(2) are formed on adjacent sides 830(1), 830(2) to the PMA region 804 in the direction of the long axis $LA_2$ to align the in-plane magnetization of the IMA regions 806(1), 806(2) along the long axis $LA_2$. For example, as will be discussed in more detail below, the IMA regions 806(1), 806(2) may be formed by removing a portion of the PMA region 804 starting from the edges 835(1), 835(2) on the sides 830(1), 830(2) of the free layer 802 towards the center $C_2$ of the free layer 802 of defined respective lengths $L_3$, $L_4$. This may be relatively easy to achieve during the fabrication of the SOT-MTJ device since the substrate 808 may be rotated during etching of the material layers to form the MTJ 814. The direction of magnetization in the IMA regions 806(1), 806(2) can be set by applying an external field after the patterning. In this example, the IMA regions 806(1), 806(2) are disposed adjacent to the PMA region 804 along the long axis $LA_2$ in a cross-section of the free layer 802 along line $A_2$-$A_2$, along a plane substantially parallel to the substrate 808. In this example, a ratio of a diameter $D_3$ of the PMA region 804 along the long axis $LA_2$ to a diameter $D_4$ of the overall eye-shaped structure 826 that includes the IMA regions 806(1), 806(2) may be between approximately 0.4 and 0.8 to achieve the desired ratio of PMA and IMA in the free layer 802.

With continuing reference to FIG. 8D-1, the top electrode 812 may comprise a heavy metal material, such Tantalum (Ta), Tungsten (W), Hafnium (Hf), and Platinum (Pt), to achieve the desired spin torque generated by the spin-orbit coupling between the top electrode 812 to the free layer 802 as a result of the in-plane SOT switching current $I_S$. The pinned layer 816 may also be a metal material from at least one of a Cobalt (Co), Platinum (Pt), Nickel (Ni), Palladium (Pd), and Hafnium (Hf) material. For example, the pinned layer 816 may be material comprising at least one of a Co/Nickel (Ni) alloy, a Co/Pd alloy, an Iron (Fe)/Boron (B) alloy, a Co/Pt alloy, a Gadolinium (Gd)/Fe alloy, a Co/Fe alloy, a Co/Fe/B alloy, or a Ta/Fe/Co alloy. The free layer 802 may also be a material that includes at least one of a Co, Fe, and B material.

The next exemplary fabrication stage 800(5) of fabricating the SOT-MTJ device 834 is to encapsulate the SOT-MTJ device 834 as shown in FIG. 8E. As shown therein, an encapsulation material 836 is disposed on the outer edges of the SOT-MTJ device 834 to prevent short circuits across material layers therein. The SOT-MTJ device 834 may be further encapsulated by an outer oxide 838.

FIGS. 9A-9E illustrate exemplary fabrication stages of fabricating an exemplary top-pinned SOT-MTJ device employing a free layer having both PMA and IMA regions to facilitate SOT switching of magnetic orientation.

Figure 9A:
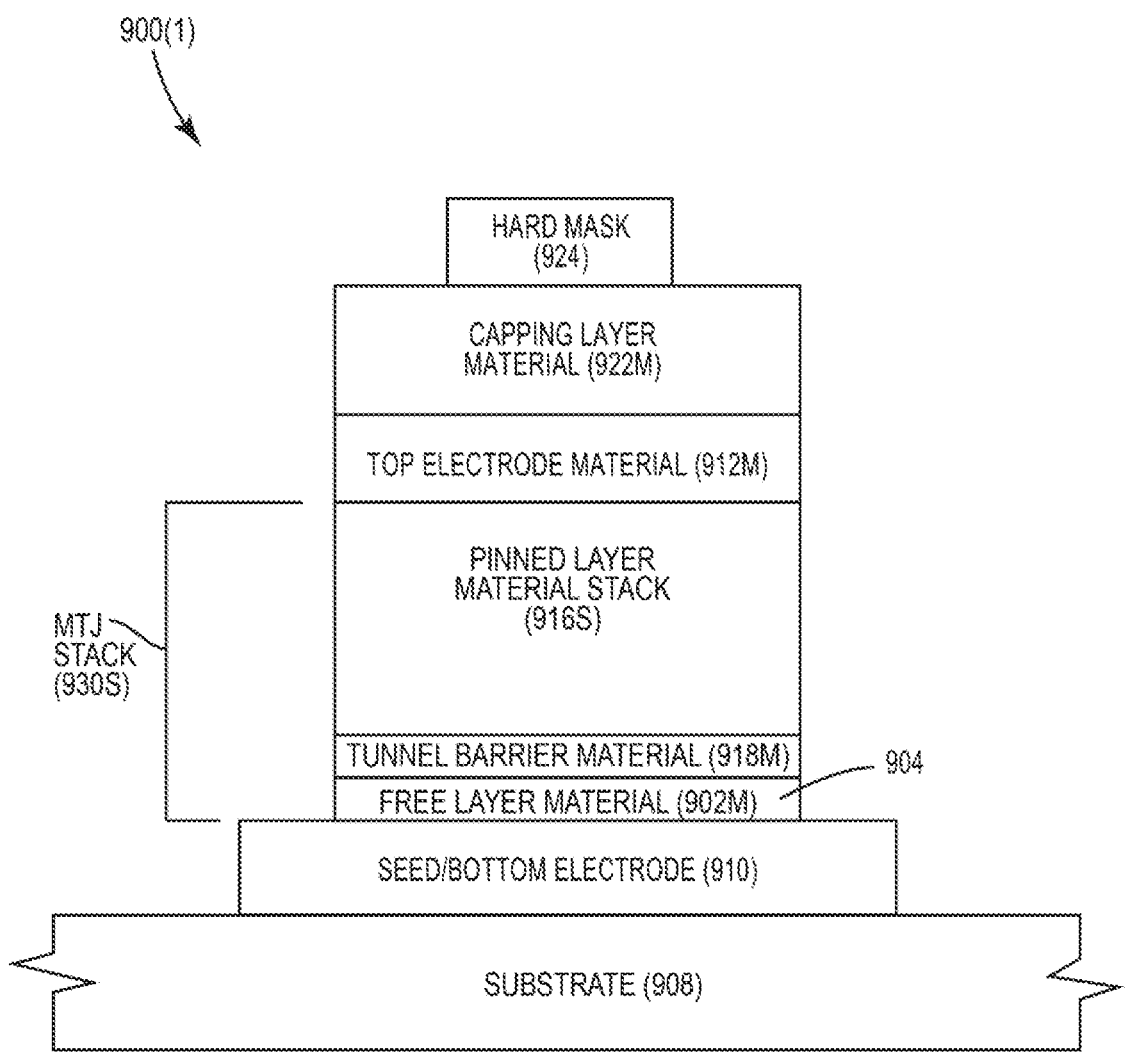
FIGS. 9A-9E illustrate exemplary fabrication stages of fabricating an exemplary top-pinned SOT-MTJ device employing a free layer having both PMA and IMA regions to facilitate SOT switching of magnetic orientation.

In this regard, FIG. 9A illustrates a first exemplary fabrication stage 900(1) of fabricating a SOT-MTJ device. A substrate 908 is provided. A bottom electrode 910 is formed above and on top of the substrate 908. A free layer material 902M of a ferromagnetic material that has a PMA such that the free layer material 902M has a free perpendicular magnetization is disposed on the bottom electrode 910 such that the eventual SOT-MTJ device fabricated will be in a top-pinned configuration. A tunnel barrier material 918M is disposed on the free layer material 902M. A pinned layer material stack 916S that includes one or more ferromagnetic materials having a fixed or pinned perpendicular magnetization is disposed on the tunnel barrier material 918M. The bottom electrode 910 may also include a seed layer on which the free layer material 902M can be formed. The free layer material 902M, the tunnel barrier material 918M, and the pinned layer material stack 916S form a MTJ stack 930S. A top electrode material 912M comprising a metal material is formed on the pinned layer material stack 916S. A capping layer material 922M is formed on the top electrode material 912M. A hard mask 924 is disposed above the top electrode material 912M.

The top electrode material 912M may comprise a heavy metal material (e.g., having a high atomic weight), such as Ta, W, Hf, and Pt, to achieve the desired spin torque generated by the spin-orbit coupling between the bottom electrode material 910M to the free layer material 902M as a result of the in-plane SOT switching current $I_S$. The pinned layer material stack 916S may also be a metal material from at least one of a Co, Pt, Ni, Pd, and Hf material. For example, the pinned layer material stack 916S may be material comprising at least one of a Co/Ni alloy, a Co/Pd alloy, an Fe/B alloy, a Co/Pt alloy, a Gd/Fe alloy, a Co/Fe alloy, a Co/Fe/B alloy, or a Ta/Fe/Co alloy. The free layer material 902M may also be a material that includes at least one of a Co, Fe, and B material.

Figure 9B:
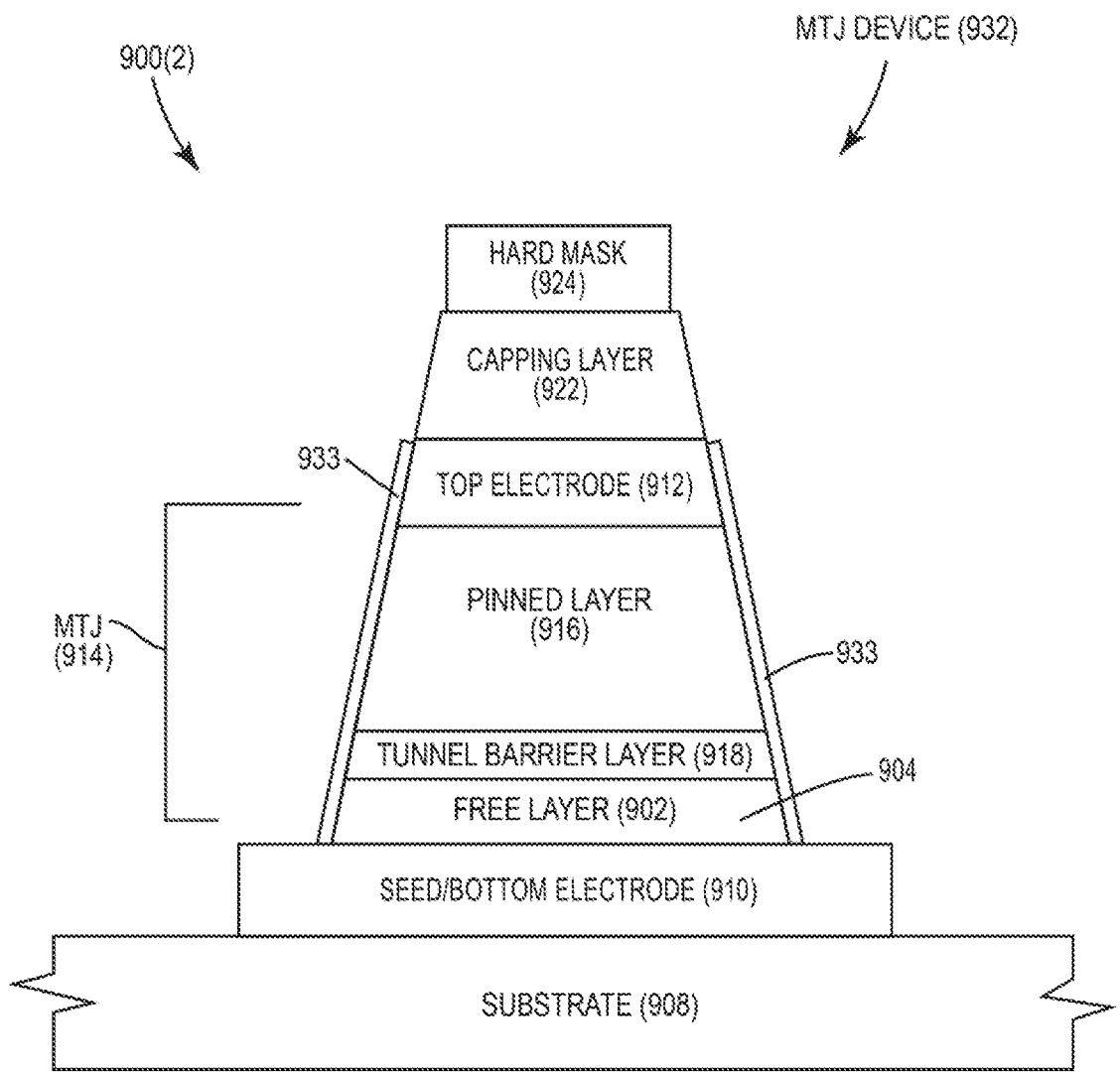
Figure 9C:
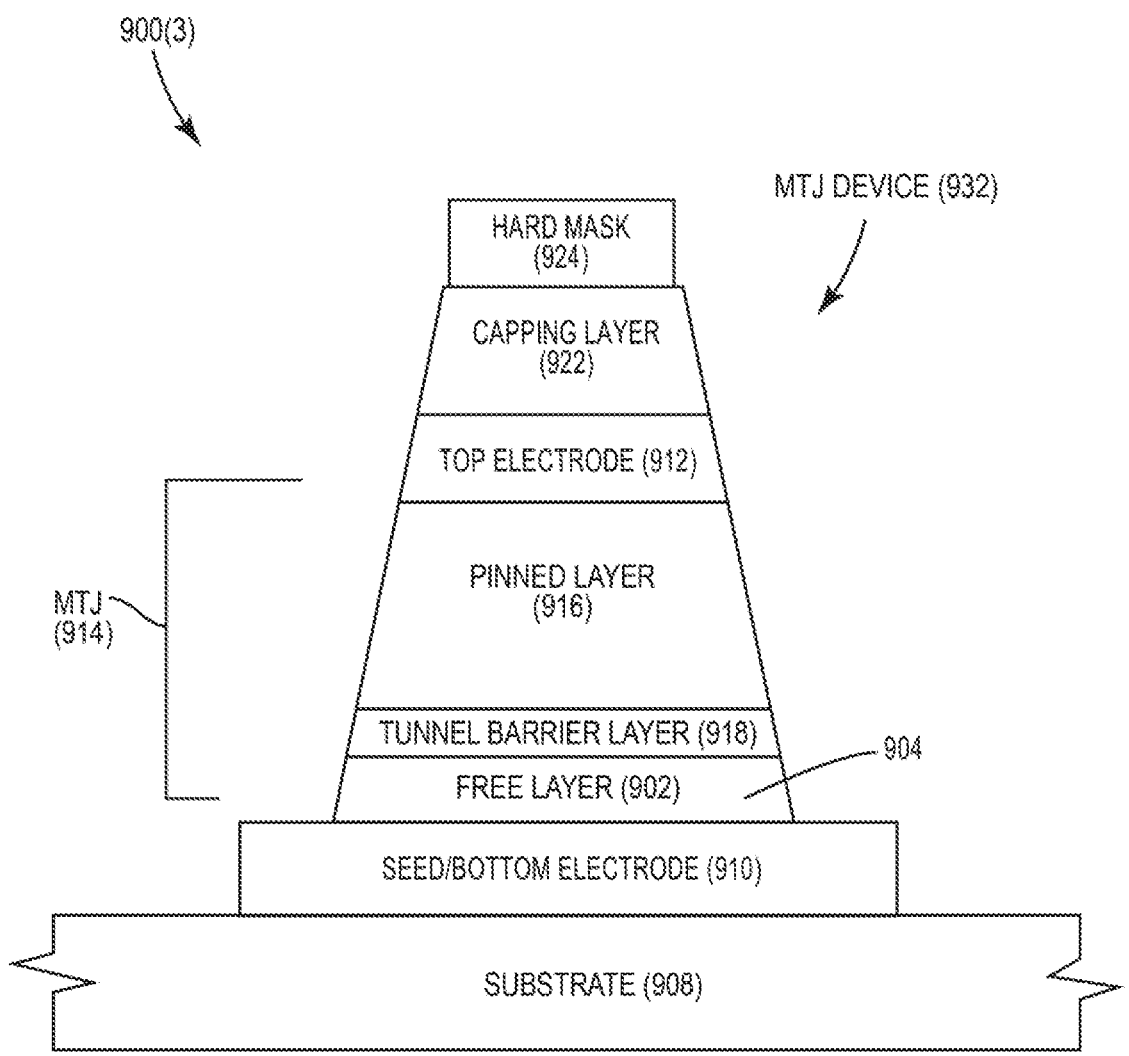

FIG. 9B illustrates a next exemplary fabrication stage 900(2) of fabricating a SOT-MTJ device. As shown therein, the MTJ stack 930S has been etched to form a MTJ device 932. The MTJ stack 930S has been etched to form a free layer 902, a tunnel barrier layer 918, and a pinned layer 916 as part of a MTJ 914 from the respective pinned layer material stack 916S, the tunnel barrier material 918M, and the free layer material 902M. A top electrode 912 is also formed from the etching of the top electrode material 912M. A capping layer 922 is also formed from the etching of the capping layer material 922M. As examples, the MTJ patterning or etching process used to form the MTJ device 932 can include IBE and chemical etching in a RIE process. The etched material may be redeposited as redeposited material 933 on the sides of the MTJ 914. IBE may be used for etching materials that have tendencies to not react well to chemical etching. An IBE process can avoid or reduce damage zones over RIE processes, but no chemical component is involved to maintain lithography patterns and process flexibility. As shown in FIG. 9C, a next exemplary fabrication stage 900(3) of fabricating a SOT-MTJ device may be to remove the redeposited material 933 on the sides of the MTJ 914.

Figures 1, 9D:
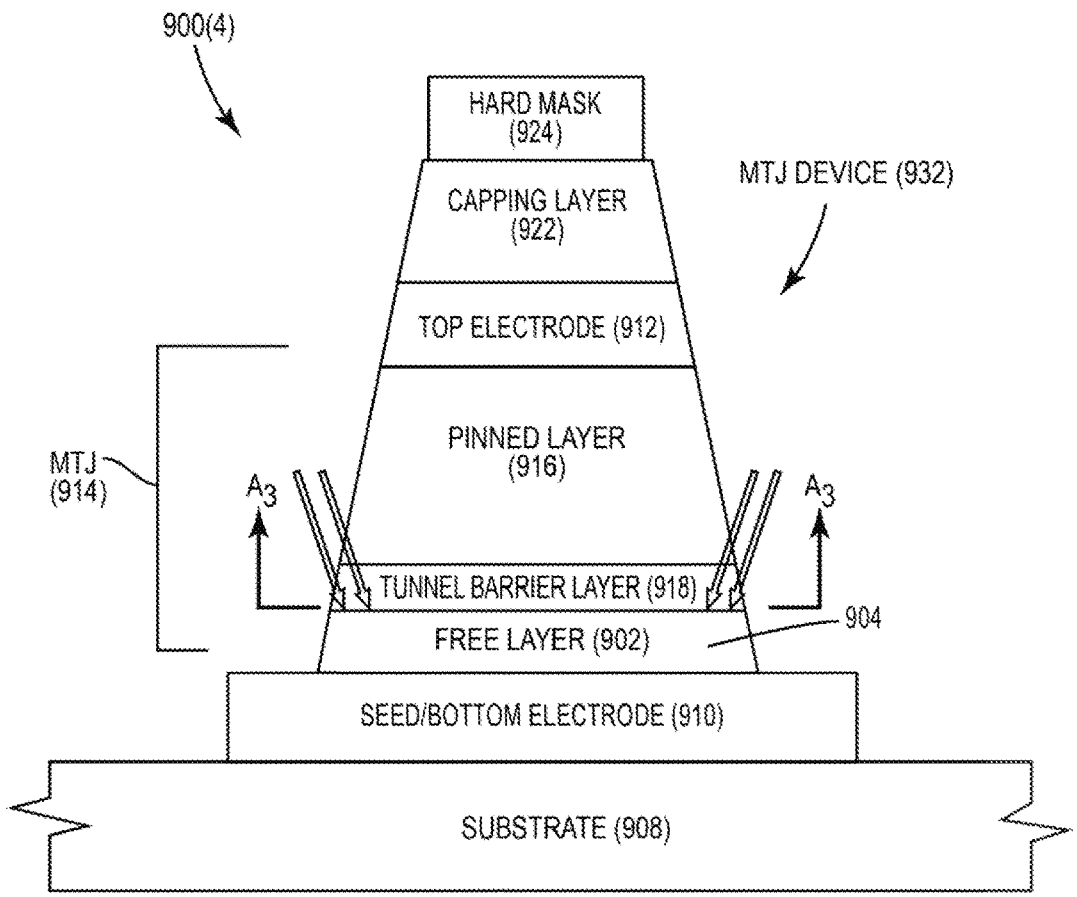
Figures 2, 9D:
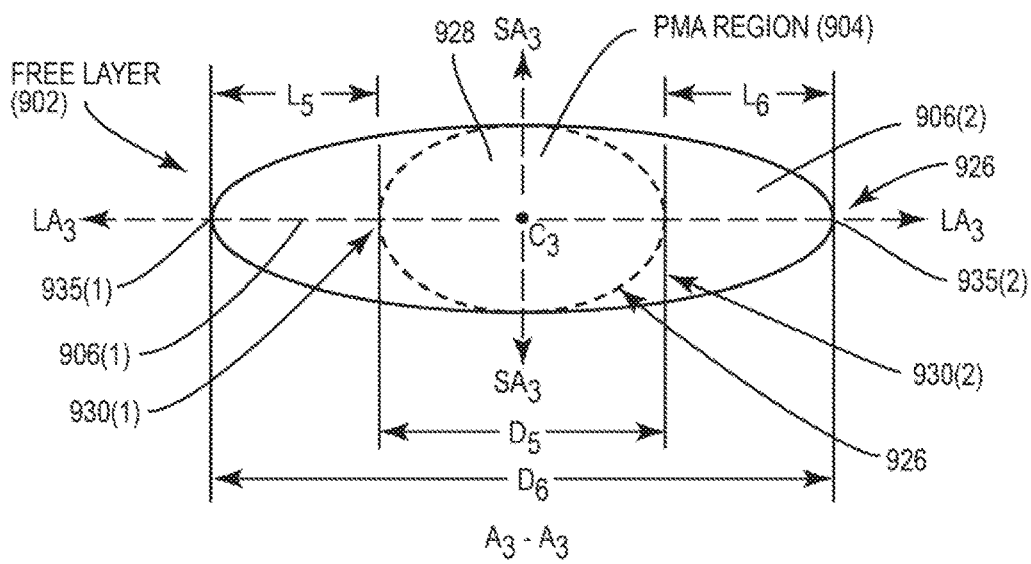
Figure 9E:
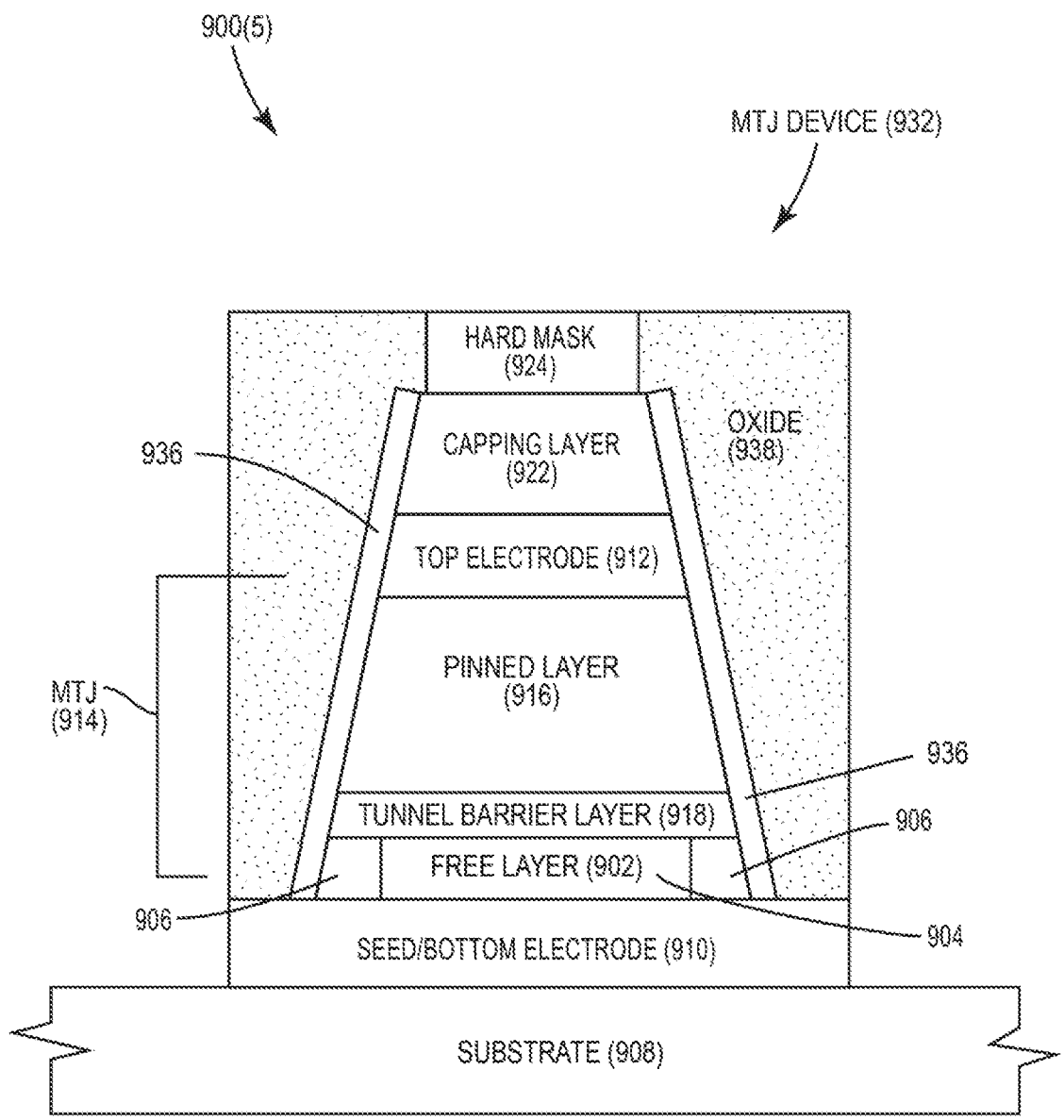

FIGS. 9D-1 and 9D-2 illustrate a next exemplary fabrication stage 900(4) of fabricating a SOT-MTJ device to provide for the free layer 902 to include both a PMA region 904 and an IMA region 906. As shown in FIG. 9D-1, the free layer 902 is etched to remove a portion of the PMA region 904 therein to form the IMA region 906 as shown in the top view cross section of the free layer 902 in FIG. 9D-2. The SOT-MTJ device 934 shown in a next exemplary fabrication stage 900(5) in FIG. 9E is formed. For example, the free layer 902 may be etched using an ion-milling process to remove a portion of the PMA region 904 from the free layer 902 to form the IMA region 906. As previously discussed, the PMA region 904 in the free layer 902 allows for the magnetic moment of the free layer 902 to be switched. The IMA region 906 having a fixed magnetization in an in-plane orientation to the substrate 908 provides an in-plane magnetization in the MTJ 914 to generate an effective magnetic field in the free layer 902 to assist in switching the magnetic moment of the free layer 902 to a perpendicular orientation in response to a SOT switching current $I_S$ applied in-plane to the top electrode 912. Thus, as an example, an external magnetic field to generate a magnetic field in the free layer 902 may not be required to achieve a perpendicular magnetic orientation. This mixture of the PMA region 904 and the IMA region 906 in the free layer 902 of the SOT-MTJ device 934 can achieve high-speed switching like a SRAM device, yet the SOT-MTJ device 934 can still be a non-volatile memory device for data retention over a power cycle.

As shown in FIG. 9D-2, in this example, the free layer 902 of the MTJ 914 has a PMA region 904 and IMA regions 906(1), 906(2) that form an eye-shaped structure 926 to provide a shape anisotropy in the free layer 902. The shape anisotropy of the free layer 902 is the anisotropy associated with the shape of the free layer 902. In this regard, the free layer 902 has an elongated shape that has a long axis $LA_3$ and a short axis $SA_3$. The shape anisotropy in the free layer 902 creates a favorable energy for magnetization in the free layer 902 in the direction of the long axis $LA_3$ and an unfavorable energy for magnetization in the free layer 902 in the direction of the short axis $SA_3$. In this example, the PMA region 904 is an inner circular-shaped region 928 of the eye-shaped structure 926 having a center $C_3$. The IMA regions 906(1), 906(2) are formed on adjacent sides 930(1), 930(2) to the PMA region 904 in the direction of the long axis $LA_3$ to align the in-plane magnetization of the IMA regions 906(1), 906(2) along the long axis $LA_3$. For example, as will be discussed in more detail below, the IMA regions 906(1), 906(2) may be formed by removing a portion of the PMA region 904 starting from the edges 935(1), 935(2) on the sides 930(1), 930(2) of the free layer 902 towards the center $C_3$ of the free layer 902 of defined respective lengths $L_5$, $L_6$. This may be relatively easy to achieve during the fabrication of the SOT-MTJ device since the substrate 908 may be rotated during etching of the material layers to form the MTJ 914. The direction of magnetization in the IMA regions 906(1), 906(2) can be set by applying an external field after the patterning. In this example, the IMA regions 906(1), 906(2) are disposed adjacent to the PMA region 904 along the long axis $LA_3$ in a cross-section of the free layer 902 along line $A_3$-$A_3$, along a plane substantially parallel to the substrate 908. In this example, a ratio of a diameter $D_5$ of the PMA region 904 along the long axis $LA_3$ to a diameter $D_6$ of the overall eye-shaped structure 926 that includes the IMA regions 906(1), 906(2) may be between approximately 0.4 and 0.8 to achieve the desired ratio of PMA and IMA in the free layer 902.

With continuing reference to FIG. 9D-1, the top electrode 912 may comprise a heavy metal material, such Tantalum (Ta), Tungsten (W), Hafnium (Hf), and Platinum (Pt), to achieve the desired spin torque generated by the spin-orbit coupling between the top electrode 912 to the free layer 902 as a result of the in-plane SOT switching current $I_S$. The pinned layer 916 may also be a metal material from at least one of a Cobalt (Co), Platinum (Pt), Nickel (Ni), Palladium (Pd), and Hafnium (Hf) material. For example, the pinned layer 916 may be material comprising at least one of a Co/Nickel (Ni) alloy, a Co/Pd alloy, an Iron (Fe)/Boron (B) alloy, a Co/Pt alloy, a Gadolinium (Gd)/Fe alloy, a Co/Fe alloy, a Co/Fe/B alloy, or a Ta/Fe/Co alloy. The free layer 902 may also be a material that includes at least one of a Co, Fe, and B material.

The next exemplary fabrication stage 900(5) of fabricating the SOT-MTJ device 934 is to encapsulate the SOT-MTJ device 934 as shown in FIG. 9E. As shown therein, an encapsulation material 936 is disposed on the outer edges of the STO-MTJ device 934 to prevent short circuits across material layers therein. The SOT-MTJ device 934 may be further encapsulated by an outer oxide 938.

A SOT-MTJ device employing a free layer having both PMA and IMA regions to facilitate SOT switching of magnetic orientation, including, but not limited to, the SOT-MTJ devices 500, 834, and 934 in FIGS. 5A, 8E, and 9E, and according to any aspects disclosed herein, including being included in MRAM bit cells, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
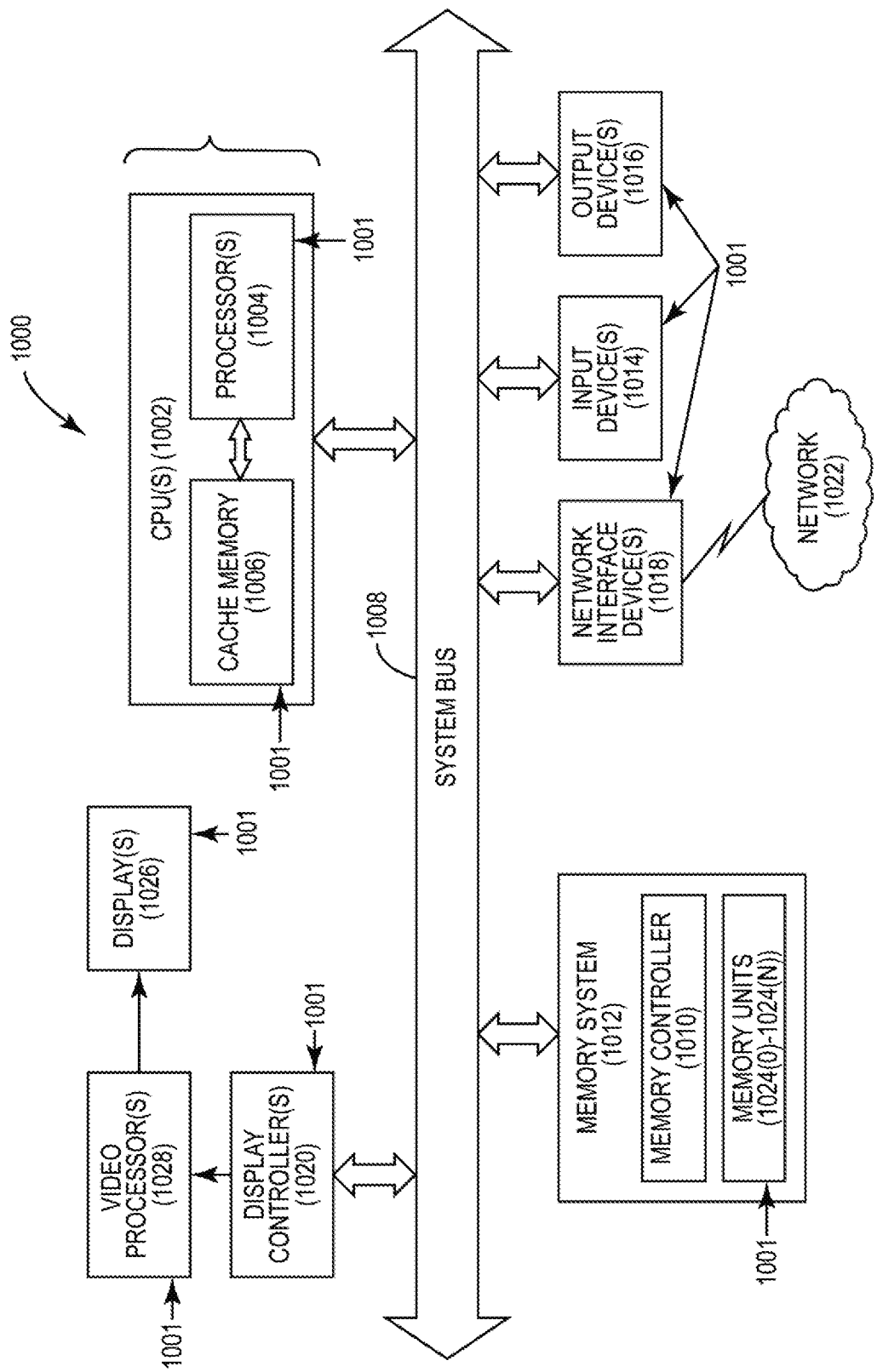
FIG. 10 is a block diagram of an exemplary processor-based system that can include a SOT-MTJ device employing a free layer having both PMA and IMA regions to facilitate SOT switching of magnetic orientation, including, but not limited to, the SOT-MTJ devices in FIGS. 5A, 8E, and 9E.

In this regard, FIG. 10 illustrates an example of a processor-based system 1000 that can include a SOT-MTJ device(s) 1001 employing a free layer having both PMA and IMA regions to facilitate SOT switching of magnetic orientation, including, but not limited to, the SOT-MTJ devices 500, 834, and 934 in FIGS. 5A, 8E, and 9E, and according to any aspects disclosed herein, including being included in MRAM bit cells. In this example, the processor-based system 1000 includes one or more central processing units (CPUs) 1002, each including one or more processors 1004. The CPU(s) 1002 may have cache memory 1006 coupled to the processor(s) 1004 for rapid access to temporarily stored data. As an example, the cache memory 1006 could include a SOT-MTJ device(s) 1001 employing a free layer having both PMA and IMA regions to facilitate SOT switching of magnetic orientation, including, but not limited to, the SOT-MTJ devices 500, 834, and 934 in FIGS. 5A, 8E, and 9E, and according to any aspects disclosed herein, including being included in MRAM bit cells. The CPU(s) 1002 is coupled to a system bus 1008 and can intercouple master and slave devices included in the processor-based system 1000. As is well known, the CPU(s) 1002 communicates with these other devices by exchanging address, control, and data information over the system bus 1008. For example, the CPU(s) 1002 can communicate bus transaction requests to a memory controller 1010 as an example of a slave device. Although not illustrated in FIG. 10, multiple system buses 1008 could be provided, wherein each system bus 1008 constitutes a different fabric.

Other master and slave devices can be connected to the system bus 1008. As illustrated in FIG. 10, these devices can include a memory system 1012, one or more input devices 1014, one or more output devices 1016, one or more network interface devices 1018, and one or more display controllers 1020, as examples. Each of the memory system 1012, the one or more input devices 1014, the one or more output devices 1016, the one or more network interface devices 1018, and the one or more display controllers 1020 can include a SOT-MTJ device(s) 1001 employing a free layer having both PMA and IMA regions to facilitate SOT switching of magnetic orientation, including, but not limited to, the SOT-MTJ devices 500, 834, and 934 in FIGS. 5A, 8E, and 9E, and according to any aspects disclosed herein, including being included in MRAM bit cells. The input device(s) 1014 can include any type of input device, including, but not limited to, input keys, switches, voice processors, etc. The output device(s) 1016 can include any type of output device, including, but not limited to, audio, video, other visual indicators, etc. The network interface device(s) 1018 can be any device configured to allow exchange of data to and from a network 1022. The network 1022 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1018 can be configured to support any type of communications protocol desired. The memory system 1012 can include one or more memory units 1024(0)-1024(N).

The CPU(s) 1002 may also be configured to access the display controller(s) 1020 over the system bus 1008 to control information sent to one or more displays 1026. The display controller(s) 1020 sends information to the display(s) 1026 to be displayed via one or more video processors 1028, which process the information to be displayed into a format suitable for the display(s) 1026. The display(s) 1026 can include any type of display, including, but not limited to, a cathode ray tube (CRT), a liquid crystal display (LCD), a plasma display, a light emitting diode (LED) display, etc. The display controller(s) 1020, display(s) 1026, and/or the video processor(s) 1028 can include a SOT-MTJ device(s) 1001 employing a free layer having both PMA and IMA regions to facilitate SOT switching of magnetic orientation, including, but not limited to, the SOT-MTJ devices 500, 834, and 934 in FIGS. 5A, 8E, and 9E, and according to any aspects disclosed herein, including being included in MRAM bit cells.

Figure 11:
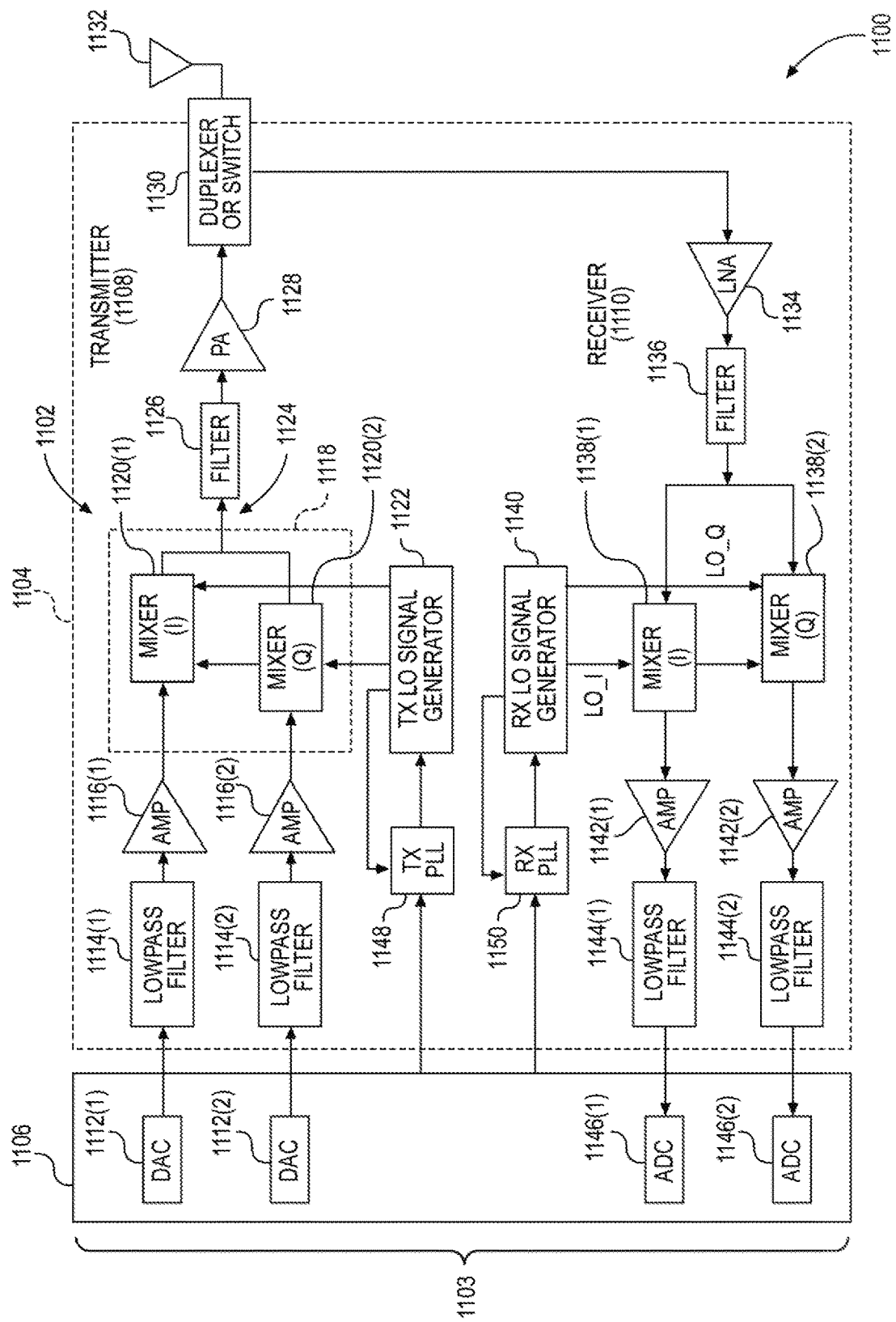
FIG. 11 is a block diagram of an exemplary wireless communications device that includes radio frequency (RF) components formed in an integrated circuit (IC), wherein any of the components therein can include a SOT-MTJ device employing a free layer having both PMA and IMA regions to facilitate SOT switching of magnetic orientation, including, but not limited to, the SOT-MTJ devices in FIGS. 5A, 8E, and 9E.

FIG. 11 illustrates an exemplary wireless communications device 1100 that includes radio frequency (RF) components formed in an integrated circuit (IC) 1102, wherein any of the components therein can include a SOT-MTJ device(s) 1103 employing a free layer having both PMA and IMA regions to facilitate SOT switching of magnetic orientation, including, but not limited to, the SOT-MTJ devices 500, 834, and 934 in FIGS. 5A, 8E, and 9E, and according to any aspects disclosed herein, including being included in MRAM bit cells. In this regard, the wireless communications device 1100 may be provided in the IC 1102. The wireless communications device 1100 may include or be provided in any of the above-referenced devices, as examples. As shown in FIG. 11, the wireless communications device 1100 includes a transceiver 1104 and a data processor 1106. The data processor 1106 may include a memory to store data and program codes. The transceiver 1104 includes a transmitter 1108 and a receiver 1110 that support bi-directional communications. In general, the wireless communications device 1100 may include any number of transmitters 1108 and/or receivers 1110 for any number of communication systems and frequency bands. All or a portion of the transceiver 1104 may be implemented on one or more analog ICs, RF ICs (RFICs), mixed-signal ICs, etc.

The transmitter 1108 or the receiver 1110 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1110. In the direct-conversion architecture, a signal is frequency-converted between RF and baseband in one stage. The super-heterodyne and direct-conversion architectures may use different circuit blocks and/or have different requirements. In the wireless communications device 1100 in FIG. 11, the transmitter 1108 and the receiver 1110 are implemented with the direct-conversion architecture.

In the transmit path, the data processor 1106 processes data to be transmitted and provides I and Q analog output signals to the transmitter 1108. In the exemplary wireless communications device 1100, the data processor 1106 includes digital-to-analog converters (DACs) 1112(1) and 1112(2) for converting digital signals generated by the data processor 1106 into the I and Q analog output signals, e.g., I and Q output currents, for further processing.

Within the transmitter 1108, lowpass filters 1114(1) and 1114(2) filter the I and Q analog output signals, respectively, to remove undesired signals caused by the prior digital-to-analog conversion. Amplifiers (AMPs) 1116(1) and 1116(2) amplify the signals from the lowpass filters 1114(1) and 1114(2), respectively, and provide I and Q baseband signals. An upconverter 1118 upconverts the I and Q baseband signals with I and Q transmit (TX) local oscillator (LO) signals through mixers 1120(1) and 1120(2) from a TX LO signal generator 1122 to provide an upconverted signal 1124. A filter 1126 filters the upconverted signal 1124 to remove undesired signals caused by the frequency upconversion as well as noise in a receive frequency band. A power amplifier (PA) 1128 amplifies the upconverted signal 1124 from the filter 1126 to obtain the desired output power level and provides a transmit RF signal. The transmit RF signal is routed through a duplexer or switch 1130 and transmitted via an antenna 1132.

In the receive path, the antenna 1132 receives signals transmitted by base stations and provides a received RF signal, which is routed through the duplexer or switch 1130 and provided to a low noise amplifier (LNA) 1134. The duplexer or switch 1130 is designed to operate with a specific receive (RX)-to-TX duplexer frequency separation, such that RX signals are isolated from TX signals. The received RF signal is amplified by the LNA 1134 and filtered by a filter 1136 to obtain a desired RF input signal. Downconversion mixers 1138(1) and 1138(2) mix the output of the filter 1136 with I and Q RX LO signals (i.e., LO_I and LO_Q) from an RX LO signal generator 1140 to generate I and Q baseband signals. The I and Q baseband signals are amplified by amplifiers (AMPs) 1142(1) and 1142(2) and further filtered by lowpass filters 1144(1) and 1144(2) to obtain I and Q analog input signals, which are provided to the data processor 1106. In this example, the data processor 1106 includes analog-to-digital converters (ADCs) 1146(1) and 1146(2) for converting the analog input signals into digital signals to be further processed by the data processor 1106.

In the wireless communications device 1100 of FIG. 11, the TX LO signal generator 1122 generates the I and Q TX LO signals used for frequency upconversion, while the RX LO signal generator 1140 generates the I and Q RX LO signals used for frequency downconversion. Each LO signal is a periodic signal with a particular fundamental frequency. A TX phase-locked loop (PLL) circuit 1148 receives timing information from the data processor 1106 and generates a control signal used to adjust the frequency and/or phase of the TX LO signals from the TX LO signal generator 1122. Similarly, an RX PLL circuit 1150 receives timing information from the data processor 1106 and generates a control signal used to adjust the frequency and/or phase of the RX LO signals from the RX LO signal generator 1140.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure.

Thus, the disclosure is not intended to be limited to the examples and designs described herein, but is to be accorded the widest scope consistent with the principles and novel features disclosed herein.

What is claimed is:

1. A magnetic tunnel junction (MTJ) device comprising a MTJ comprising:
   a tunnel barrier disposed above a substrate;
   a pinned layer comprising a ferromagnetic material having a fixed perpendicular magnetic anisotropy (PMA), the pinned layer disposed adjacent to a first side of the tunnel barrier;
   a free layer comprising a ferromagnetic material disposed adjacent to a second side of the tunnel barrier opposite of the first side of the tunnel barrier, the free layer having a cross-section parallel to the substrate and comprising:
      at least one PMA region in the cross-section, the at least one PMA region having a free magnetization in a perpendicular orientation to the substrate; and
      at least one in-plane magnetic anisotropy (IMA) region in the cross-section, the at least one IMA region having a fixed magnetization in an in-plane orientation to the substrate.

2. The MTJ device of claim 1, wherein the at least one IMA region of the free layer induces a magnetic field in the free layer.

3. The MTJ device of claim 2, wherein the magnetic field induced by the at least one IMA region in the free layer assists in the switching of the free magnetization of the at least one PMA region in the free layer to the perpendicular orientation in response to a spin-orbit torque (SOT) switching current applied to the MTJ.

4. The MTJ device of claim 1, wherein the free layer is of a shaped anisotropy.

5. The MTJ device of claim 1, wherein the free layer comprises an eye-shaped structure having a long axis and a short axis orthogonal to the long axis.

6. The MTJ device of claim 5, wherein:
   the at least one PMA region comprises a PMA region comprising a circular-shaped PMA region in the cross-section and having a free magnetization in a perpendicular orientation to the substrate, and having a first side in the cross-section on the long axis of the free layer and a second side in the cross-section opposite the first side in the long axis of the free layer; and
   the at least one IMA region comprises:
      a first IMA region in the cross-section disposed adjacent to the first side of the PMA region along the long axis of the free layer; and
      a second IMA region in the cross-section disposed adjacent to the second side of the PMA region along the long axis of the free layer.

7. The MTJ device of claim 6, wherein:
   the PMA region has a first diameter along the long axis of the free layer;
   the free layer has a second diameter along the long axis of the free layer;
   the first IMA region has a first length less than the second diameter along the long axis of the free layer; and
   the second IMA region has a second length less than the second diameter along the long axis of the free layer.

8. The MTJ device of claim 7, wherein a ratio of the first diameter to the second diameter is 0.4-0.8.

9. The MTJ device of claim 7, wherein the first length and the second length are equal.

10. The MTJ device of claim 1, further comprising:
    a bottom electrode comprised of a metal material disposed above the substrate; and
    a top electrode comprised of a metal material disposed above the bottom electrode.

11. The MTJ device of claim 10, wherein the bottom electrode comprises a heavy metal.

12. The MTJ device of claim 10, wherein the metal material of the bottom electrode comprises at least one material of Tantalum (Ta), Tungsten (W), Hafnium (Hf), and Platinum (Pt).

13. The MTJ device of claim 1, wherein:
    the tunnel barrier is disposed above the pinned layer; and
    the free layer is disposed above the tunnel barrier.

14. The MTJ device of claim 1, wherein:
    the tunnel barrier is disposed above the free layer; and
    the pinned layer is disposed above the tunnel barrier.

15. The MTJ device of claim 1, wherein the tunnel barrier comprises Magnesium Oxide (MgO).

16. The MTJ device of claim 1, wherein the pinned layer is comprised of a material comprising at least one of Cobalt (Co), Platinum (Pt), Nickel (Ni), Palladium (Pd), and Hafnium (Hf).

17. The MTJ device of claim 1, wherein the pinned layer is comprised of a material comprising at least one of a Cobalt (Co)/Nickel (Ni) alloy, a Co/Palladium (Pd) alloy, an Iron (Fe)/Boron (B) alloy, a Co/Platinum (Pt) alloy, a Gadolinium (Gd)/Fe alloy, a Co/Fe alloy, a Co/Fe/B alloy, or a Tantalum (Ta)/Fe/Co alloy.

18. The MTJ device of claim 1, wherein the pinned layer is comprised of a material comprising at least one of Cobalt (Co), Iron (Fe), and Boron (B).

19. The MTJ device of claim 1 integrated into an integrated circuit (IC).

20. The MTJ device of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

21. A magneto-resistive random access memory (MRAM) bit cell, comprising:
    an access transistor comprising a gate coupled to a word line, a source, and a drain; and
    a spin-orbit torque (SOT) magnetic tunnel junction (MTJ) (SOT-MTJ) device, comprising:
       a bottom electrode comprised of a metal material disposed above a substrate;
       a top electrode comprised of a metal material disposed above the bottom electrode; and
       a MTJ, comprising:
          a tunnel barrier disposed above the substrate;
          a pinned layer comprising a ferromagnetic material having a fixed perpendicular magnetic anisotropy (PMA), the pinned layer disposed adjacent to a first side of the tunnel barrier;
          a free layer comprising a ferromagnetic material disposed adjacent to a second side of the tunnel barrier opposite of the first side of the tunnel barrier, the free layer comprising:
  at least one PMA region having a free magnetization in a perpendicular orientation to the substrate; and
  at least one in-plane magnetic anisotropy (IMA) region having a fixed magnetization in an in-plane orientation to the substrate; and
    an electrode among the bottom electrode or the top electrode coupled to the source or the drain of the access transistor, and the other electrode among the bottom electrode or the top electrode coupled to a bit line;
the electrode among the bottom electrode or the top electrode configured to receive an in-plane current flowing in-plane to the bottom electrode in response to a write signal applied to the word line indicating a write active state to cause the access transistor to be activated, to generate a SOT to induce spin accumulation at an interface between the bottom electrode and the free layer to switch the magnetization of the free layer to the in-plane orientation; and
the at least one IMA region of the free layer of the MTJ induces a magnetic field in the free layer to assist in the switching of the magnetization of the at least one PMA region in the free layer to the perpendicular orientation in response to the in-plane current.

22. The MRAM bit cell of claim 21, wherein the free layer is of a shaped anisotropy.

23. The MRAM bit cell of claim 21, wherein the free layer comprises an eye-shaped structure having a long axis and a short axis orthogonal to the long axis.

24. The MRAM bit cell of claim 23, wherein:
the at least one PMA region comprises a PMA region comprising a circular-shaped PMA region having a free magnetization in a perpendicular orientation to the substrate, and having a first side on the long axis of the free layer and a second side opposite the first side in the long axis of the free layer; and the at least one IMA region comprises:
  a first IMA region disposed adjacent to the first side of the PMA region along the long axis of the free layer; and
  a second IMA region disposed adjacent to the second side of the PMA region along the long axis of the free layer.

25. The MRAM bit cell of claim 21, wherein:
the free layer has a cross-section parallel to the substrate;
the at least one PMA region is in the cross-section; and
the at least one IMA region is in the cross-section.

26. The MRAM bit cell of claim 25, wherein:
the at least one PMA region comprises a PMA region comprising a circular-shaped PMA region in the cross-section and having a free magnetization in a perpendicular orientation to the substrate, and having a first side in the cross-section on a long axis of the free layer and a second side in the cross-section opposite the first side in the long axis of the free layer; and
the at least one IMA region comprises:
  a first IMA region in the cross-section disposed adjacent to the first side of the PMA region along the long axis of the free layer; and
  a second IMA region in the cross-section disposed adjacent to the second side of the PMA region along the long axis of the free layer.

27. The MRAM bit cell of claim 26, wherein:
the PMA region has a first diameter along the long axis of the free layer;
the free layer has a second diameter along the long axis of the free layer;
the first IMA region has a first length less than the second diameter along the long axis of the free layer; and
the second IMA region has a second length less than the second diameter along the long axis of the free layer.

28. The MRAM bit cell of claim 27, wherein a ratio of the first diameter to the second diameter is 0.4-0.8.

29. The MRAM bit cell of claim 27, wherein the first length and the second length are equal.

* * * * *